(12) United States Patent
Yeh et al.

(10) Patent No.: US 12,519,066 B2
(45) Date of Patent: Jan. 6, 2026

(54) PACKAGE STRUCTURE WITH A PLURALITY OF CORNER OPENINGS COMPRISING DIFFERENT SHAPES AND METHOD OF FABRICATING THE SAME

(71) Applicant: Taiwan Semiconductor Manufacturing Company, Ltd., Hsinchu (TW)

(72) Inventors: Shu-Shen Yeh, Taoyuan (TW); Chin-Hua Wang, New Taipei (TW); Yu-Sheng Lin, Hsinchu (TW); Po-Yao Lin, Hsinchu County (TW); Shin-Puu Jeng, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 895 days.

(21) Appl. No.: 17/149,732

(22) Filed: Jan. 15, 2021

(65) Prior Publication Data
US 2022/0230969 A1    Jul. 21, 2022

(51) Int. Cl.
*H01L 23/00* (2006.01)
*H01L 23/14* (2006.01)
(Continued)

(52) U.S. Cl.
CPC ............ *H01L 23/562* (2013.01); *H01L 23/24* (2013.01); *H01L 23/49833* (2013.01);
(Continued)

(58) Field of Classification Search
CPC ........... H01L 25/0655; H01L 23/49833; H01L 23/24; H01L 23/562; H01L 23/3185; H01L 25/18
See application file for complete search history.

(56) References Cited

U.S. PATENT DOCUMENTS 6,064,117 A * 5/2000 Barrett ............... H01L 23/3128
257/738
8,802,504 B1    8/2014 Hou et al.
(Continued)

FOREIGN PATENT DOCUMENTS

CN    101636837    1/2010
CN    108431946    8/2018
(Continued)

OTHER PUBLICATIONS

Text english translation (Year: 2018).*
(Continued)

*Primary Examiner* — William B Partridge
*Assistant Examiner* — David Paul Sedorook
(74) *Attorney, Agent, or Firm* — JCIPRNET

(57) ABSTRACT

A package structure includes a circuit substrate, a semiconductor package, a first ring structure and a second ring structure. The semiconductor package is disposed on and electrically connected to the circuit substrate. The first ring structure is attached to the circuit substrate and surrounding the semiconductor package, wherein the first ring structure includes a central opening and a plurality of corner openings extending out from corners of the central opening, the semiconductor package is located in the central opening, and the plurality of corner openings is surrounding corners of the semiconductor package.

20 Claims, 21 Drawing Sheets

(51) Int. Cl.
*H01L 23/24* (2006.01)
*H01L 23/31* (2006.01)
*H01L 23/48* (2006.01)
*H01L 23/498* (2006.01)
*H01L 25/065* (2023.01)
*H01L 25/18* (2023.01)

(52) U.S. Cl.
CPC .......... *H01L 25/0655* (2013.01); *H01L 25/18* (2013.01); *H01L 23/147* (2013.01); *H01L 23/3135* (2013.01); *H01L 23/3185* (2013.01); *H01L 23/3192* (2013.01); *H01L 23/481* (2013.01); *H01L 24/16* (2013.01); *H01L 24/17* (2013.01); *H01L 24/24* (2013.01); *H01L 24/32* (2013.01); *H01L 24/33* (2013.01); *H01L 24/73* (2013.01); *H01L 2224/16145* (2013.01); *H01L 2224/16227* (2013.01); *H01L 2224/17181* (2013.01); *H01L 2224/24101* (2013.01); *H01L 2224/24137* (2013.01); *H01L 2224/32145* (2013.01); *H01L 2224/32225* (2013.01); *H01L 2224/33181* (2013.01); *H01L 2224/73204* (2013.01); *H01L 2224/73253* (2013.01)

(56) References Cited

U.S. PATENT DOCUMENTS

| | | | |
|---|---|---|---|
| 8,803,292 B2 | 8/2014 | Chen et al. | |
| 8,803,316 B2 | 8/2014 | Lin et al. | |
| 8,993,380 B2 | 3/2015 | Hou et al. | |
| 9,281,254 B2 | 3/2016 | Yu et al. | |
| 9,299,649 B2 | 3/2016 | Chiu et al. | |
| 9,372,206 B2 | 6/2016 | Wu et al. | |
| 9,425,126 B2 | 8/2016 | Kuo et al. | |
| 9,443,783 B2 | 9/2016 | Lin et al. | |
| 9,496,189 B2 | 11/2016 | Yu et al. | |
| 2007/0040267 A1* | 2/2007 | Zhao | H01L 23/24 257/E23.101 |
| 2007/0148821 A1* | 6/2007 | Do | H01L 25/0657 438/109 |
| 2008/0111234 A1* | 5/2008 | Hua | H01L 23/4275 428/221 |
| 2011/0037167 A1* | 2/2011 | Iruvanti | H01L 23/367 257/E23.101 |
| 2012/0018871 A1* | 1/2012 | Lee | H01L 23/562 257/E23.194 |
| 2012/0280374 A1* | 11/2012 | Choi | H01L 23/34 257/659 |
| 2015/0321905 A1* | 11/2015 | Gooch | G01J 5/045 257/433 |
| 2018/0342466 A1* | 11/2018 | Lin | H01L 21/56 |
| 2019/0279919 A1* | 9/2019 | Xu | H01L 25/0652 |
| 2021/0175135 A1* | 6/2021 | Hsu | H01L 31/0203 |

FOREIGN PATENT DOCUMENTS

| | | | | |
|---|---|---|---|---|
| CN | 108431946 A | * | 8/2018 | ......... H01L 21/4817 |
| TW | 201839931 | | 11/2018 | |
| WO | WO-2010080068 A1 | * | 7/2010 | ........... H01L 21/561 |

OTHER PUBLICATIONS

English translation of WO-2010080068-A1 (Year: 2010).*
"Office Action of Taiwan Counterpart Application", issued on Aug. 10, 2021, p. 1-p. 7.

* cited by examiner

PACKAGE STRUCTURE WITH A PLURALITY OF CORNER OPENINGS COMPRISING DIFFERENT SHAPES AND METHOD OF FABRICATING THE SAME

BACKGROUND

Semiconductor devices and integrated circuits used in a variety of electronic applications, such as cell phones and other mobile electronic equipment, are typically manufactured on a single semiconductor wafer. The dies of the wafer may be processed and packaged with other semiconductor devices or dies at the wafer level, and various technologies have been developed for the wafer level packaging.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the critical dimensions of the various features may be arbitrarily increased or reduced for clarity of discussion.

DETAILED DESCRIPTION

Figure 1A:
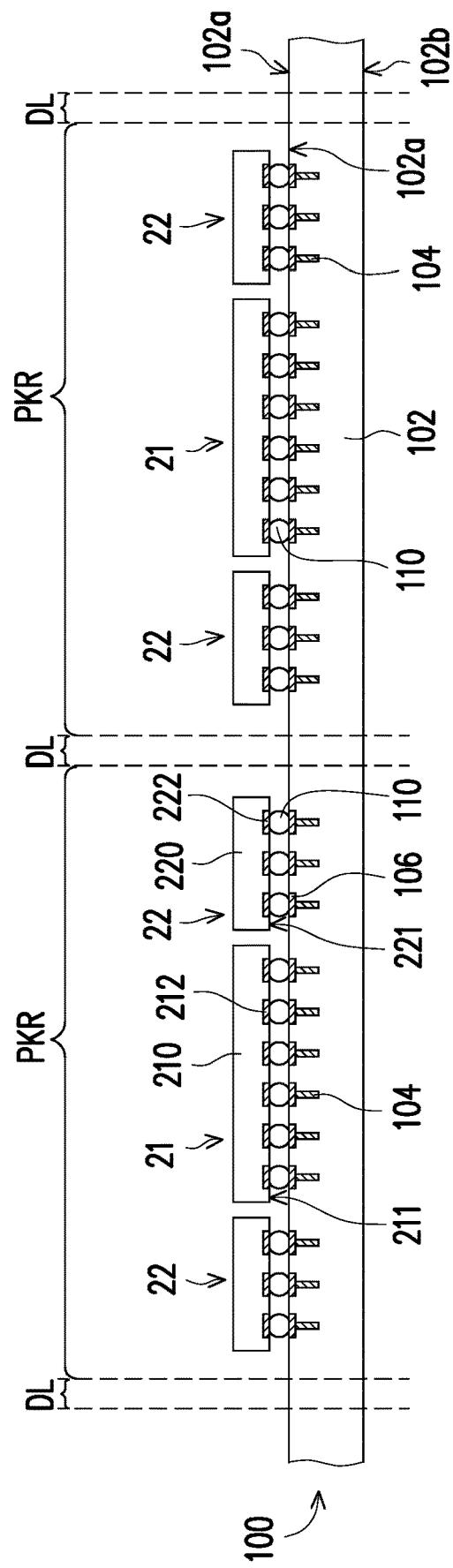
FIG. 1A to FIG. 1I are schematic top and sectional views of various stages in a method of fabricating a semiconductor package according to some exemplary embodiments of the present disclosure.
Figure 1B:
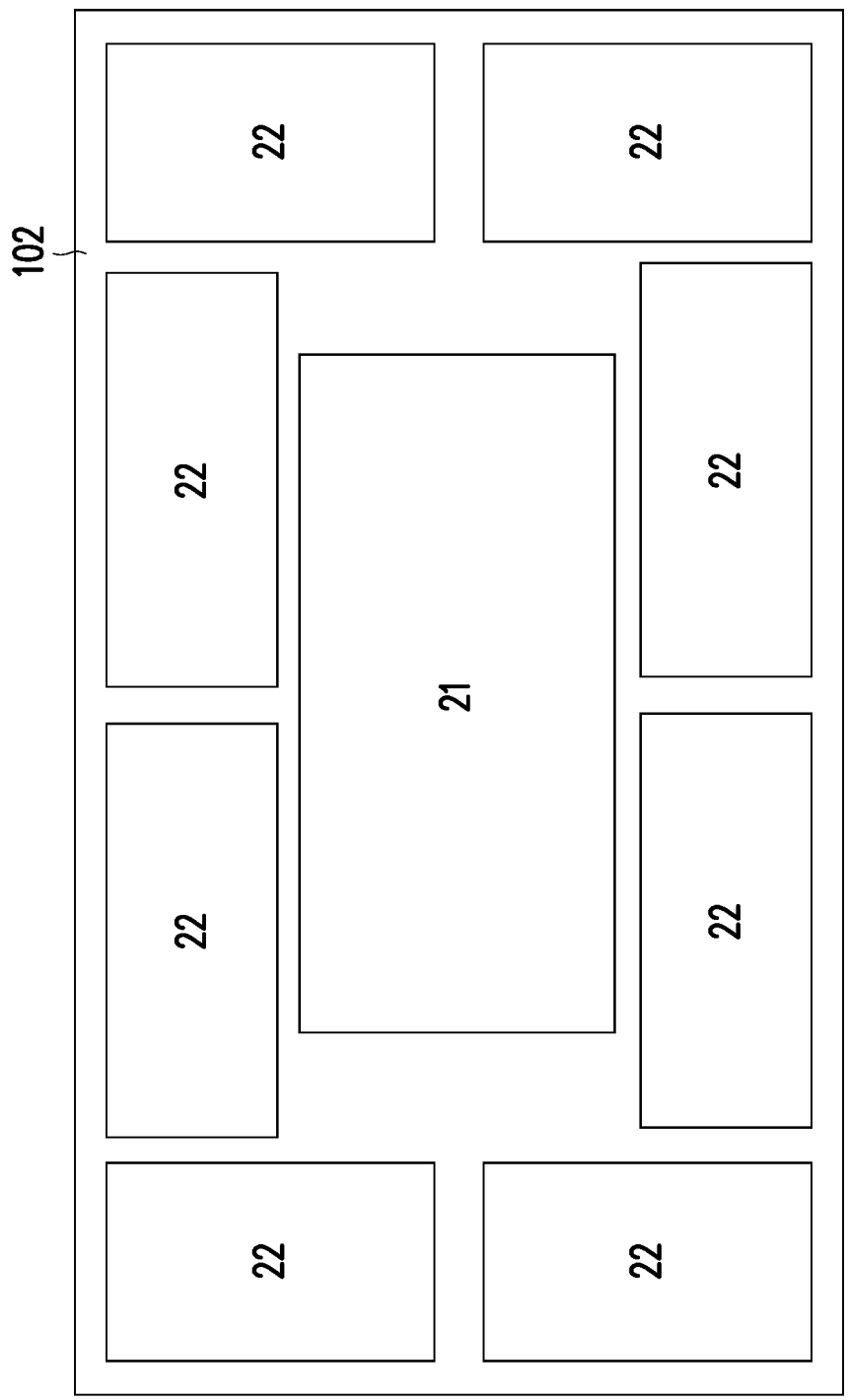

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a second feature over or on a first feature in the description that follows may include embodiments in which the second and first features are formed in direct contact, and may also include embodiments in which additional features may be formed between the second and first features, such that the second and first features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath", "below", "lower", "on", "over", "overlying", "above", "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In conventional package structures, corner molding usually has larger molding stress due to a larger molding volume, which induces local deformation and presents a higher risk of molding crack and delamination. In some embodiments of the present disclosure, while providing a ring structure (stiffener ring) to reduce the warpage of the package substrates, the design of the ring structure is modified to help reduce the molding stress and warpage of the package structure. In some embodiments, the package structure has a larger distance between the inner surfaces of the ring structure and the inner semiconductor package at corner portions, than that at other portions. The inner surfaces of the ring structure shrink at corner portions to leave more space from the inner semiconductor package.

FIG. 1A to FIG. 1I are schematic top and sectional views of various stages in a method of fabricating a semiconductor package according to some exemplary embodiments of the present disclosure. Referring to FIG. 1A, an interposer structure 100 is provided. In some embodiments, the interposer structure 100 includes a core portion 102, and a plurality of through vias 104 and conductive pads 106 formed therein. In some embodiments, the core portion 102 is a substrate such as a bulk semiconductor substrate, silicon on insulator (SOI) substrate or a multi-layered semiconductor material substrate. The semiconductor material of the substrate (core portion 102) may be silicon, germanium, silicon germanium, silicon carbide, gallium arsenic, gallium phosphide, indium phosphide, indium arsenide, indium antimonide, GaAsP, AlInAs, AlGaAs, GaInAs, GaInP, GaInAsP, or combinations thereof. In some embodiments, the core portion 102 is doped or undoped.

In some embodiments, the conductive pads 106 are formed on a first surface 102a of the core portion 102. In some embodiments, through vias 104 are formed in the core portion 102 and connected with the conductive pads 106. In some embodiments, the through vias 104 extend into the core portion 102 with a specific depth. In some embodiments, the through vias 104 are through-substrate vias. In some embodiments, the through vias 104 are through-silicon vias when the core portion 102 is a silicon substrate. In some embodiments, the through vias 104 are formed by forming holes or recesses in the core portion 102 and then filling the recesses with a conductive material. In some embodiments, the recesses are formed by, for example, etching, milling, laser drilling or the like. In some embodiments, the conductive material is formed by an electro-chemical plating process, chemical vapor deposition (CVD), atomic layer deposition (ALD) or physical vapor deposition (PVD), and the conductive material may include copper, tungsten, aluminum, silver, gold or a combination thereof. In some embodiments, the conductive pads 106 connected with the through vias 104 are formed as conductive parts of the redistribution layer(s) formed on the interposer structure 100. In some embodiments, the conductive pads 106 include under bump metallurgies (UBMs). In certain embodiments, the interposer structure 100 may further include active or passive devices, such as transistors, capacitors, resistors, or diodes passive devices formed in the core portion 102.

As shown in FIG. 1A, the core portion 102 has a plurality of package regions PKR and a dicing lane DL separating each of the plurality of package regions PKR. The through vias 104 and conductive pads 106 are formed in the core portion 102 within the package regions PKR. In some embodiments, a plurality of semiconductor dies 21 (first semiconductor dies) and a plurality of semiconductor dies 22 (second semiconductor dies) are provided on the interposer structure 100, or on the core portion 102 within the package regions PKR. The semiconductor dies 21 and semiconductor dies 22 are individual dies singulated from a wafer. In some embodiments, the semiconductor dies 21 contain the same circuitry, such as devices and metallization patterns, or the semiconductor dies 21 are the same type of dies. In some embodiments, the semiconductor dies 22 contain the same circuitry, or the semiconductor dies 22 are the same type of dies. In certain embodiments, the semiconductor dies 21 and the semiconductor dies 22 have different circuitry or are different types of dies. In some embodiments, the semiconductor dies 21 and the semiconductor dies 22 may have the same circuitry.

In some embodiments, the semiconductor dies 21 are major dies, while the semiconductor dies 22 are tributary dies. In some embodiments, the major dies are arranged on the core portion 102 in central locations of each package region PKR, while tributary dies are arranged side-by-side and spaced apart from the major dies. In some embodiments, the tributary dies are arranged aside the major dies, and around or surrounding the major dies. In one embodiment, four, six or eight tributary dies are arranged around one major die per one package region PKR. For example, referring to FIG. 1B, in an exemplary embodiment, eight semiconductor dies 22 (tributary dies) are surrounding one semiconductor die 21 (major die) in each of the package region PKR.

Referring back to FIG. 1A, in some embodiments, the semiconductor dies 21 has a surface area larger than that of the semiconductor dies 22. Also, in some embodiments, the semiconductor dies 21 and the semiconductor dies 22 are of different sizes, including different surface areas and/or different thicknesses. In some embodiments, the semiconductor dies 21 are a logic die, including a central processing unit (CPU) die, graphics processing unit (GPU) die, system-on-a-chip (SoC) die, a microcontroller or the like. In some embodiments, the semiconductor dies 21 is a power management die, such as a power management integrated circuit (PMIC) die. In some embodiments, the semiconductor dies 22 are a memory die, including dynamic random access memory (DRAM) die, static random access memory (SRAM) die or a high bandwidth memory (HBM) die. In some alternative embodiments, the semiconductor dies 22 are dummy dies, which do not perform any electrical functions. The disclosure is not limited thereto, and the number, sizes and types of the semiconductor die disposed on the core portion 102 may be appropriately adjusted based on product requirement.

As illustrated in FIG. 1A, the semiconductor dies 21 include a body 210 and connecting pads 212 formed on an active surface 211 of the body 210. In certain embodiments, the connecting pads 212 may further include pillar structures for bonding the semiconductor dies 21 to other structures. In some embodiments, the semiconductor dies 22 include a body 220 and connecting pads 222 formed on an active surface 221 of the body 220. In other embodiments, the connecting pads 222 may further include pillar structures for bonding the dies 22 to other structures.

In some embodiments, the semiconductor dies 21 and the semiconductor dies 22 are attached to the first surface 102a of the core portion 102, for example, through flip-chip bonding by way of the electrical connectors 110. Through a reflow process, the electrical connectors 110 are formed between the connecting pads 212, 222 and conductive pads 106, and are physically connecting the semiconductor dies 21, 22 to the core portion 102 of the interposer structure 100. In some embodiments, the electrical connectors 110 are located in between the semiconductor dies 21, 22 and the interposer structure 100. In certain embodiments, semiconductor dies 21, 22 are electrically connected to the through vias 104 and the conductive pads 106 through the electrical connectors 110. In some alternative embodiments, when the semiconductor dies 22 are dummy dies, the semiconductor dies 22 may be attached to the electrical connectors 110 through physical connection without establishing an electrical connection thereto. In other words, the connecting pads 222 of the semiconductor dies 22 may be dummy pads, for example.

In one embodiment, the electrical connectors 110 are micro-bumps, such as micro-bumps having copper metal pillars. In another embodiment, the electrical connectors 110 are solder bumps, lead-free solder bumps, or micro bumps, such as controlled collapse chip connection (C4) bumps or micro bumps containing copper pillars. In some embodiments, the bonding between the semiconductor dies 21, 22 and the core portion 102 is solder bonding. In some embodiments, the bonding between the semiconductor dies 21, 22 and the core portion 102 is direct metal-to-metal bonding, such as copper-to-copper bonding.

Figure 1C:
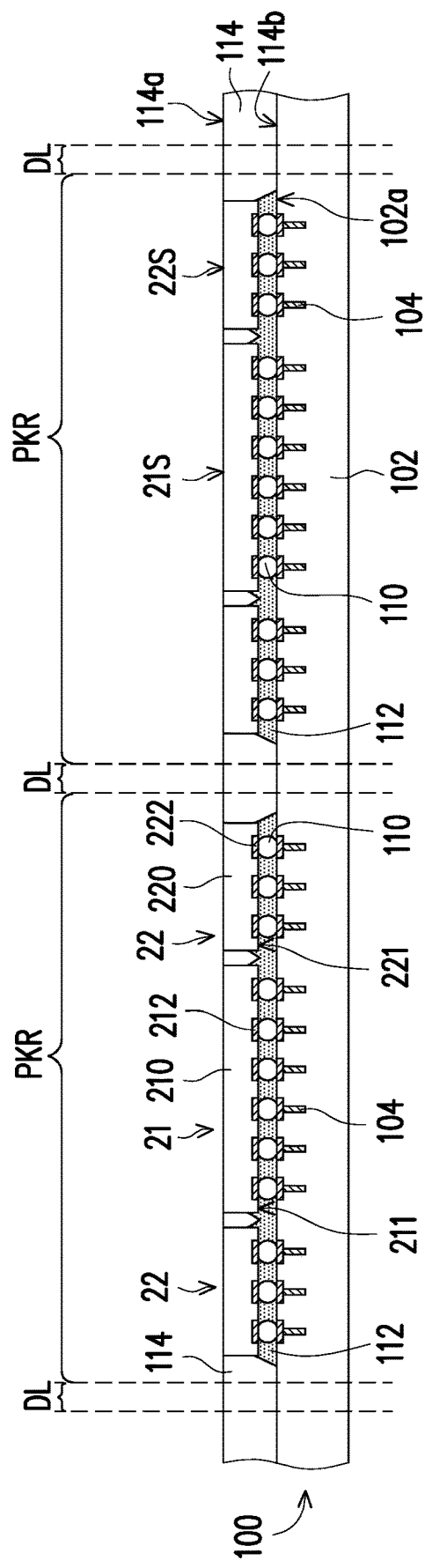

Referring to FIG. 1C, thereafter, an underfill structure 112 may be formed to cover the plurality of electrical connectors 110, and to fill up the spaces in between the semiconductor dies 21, 22 and the interposer structure 100. In some embodiments, the underfill structure 112 further cover side walls of the semiconductor dies 21, 22, and is located within the package region PKR. Thereafter, an insulating encapsulant 114 (or molding compound) may be formed over the interposer structure 100 (or over the core portion 102) to cover the underfill structure 112, and to surround the semiconductor dies 21 and 22.

In some embodiments, the insulating encapsulant 114 is formed on the first surface 102a of the core portion 102 in the package regions PKR and over the dicing lanes DL. In some embodiments, the insulating encapsulant 114 is formed through, for example, a compression molding process or transfer molding. In one embodiment, a curing process is performed to cure the insulating encapsulant 114. In some embodiments, the semiconductor dies 21, 22 and the electrical connectors 110 are encapsulated by the insulating encapsulant 114. In some embodiments, a planarization process, including grinding or polishing, is performed to partially remove the insulating encapsulant 114, exposing backside surfaces 21S, 22S of the semiconductor dies 21, 22. Accordingly, the backside surfaces 21S, 22S of the semiconductor dies 21, 22 are levelled with a top surface 114a of the insulating encapsulant 114. The top surface 114a being opposite to a backside surface 114b of the insulating encapsulant 114, wherein the backside surface 114b is in contact with the core portion 102. In some alternative embodiments, the backside surfaces 21S, 22S of the semiconductor dies 21, 22 are not exposed from the insulating encapsulant 114, and are well protected by the insulating encapsulant 114.

In some embodiments, a material of the insulating encapsulant 114 includes polymers (such as epoxy resins, phenolic resins, silicon-containing resins, or other suitable resins), dielectric materials having low permittivity (Dk) and low loss tangent (Df) properties, or other suitable materials. In an alternative embodiment, the insulating encapsulant 114 may include an acceptable insulating encapsulation material. In some embodiments, the insulating encapsulant 114 may further include inorganic filler or inorganic compound (e.g. silica, clay, and so on) which can be added therein to optimize coefficient of thermal expansion (CTE) of the insulating encapsulant 114. The disclosure is not limited thereto.

Figure 1D:
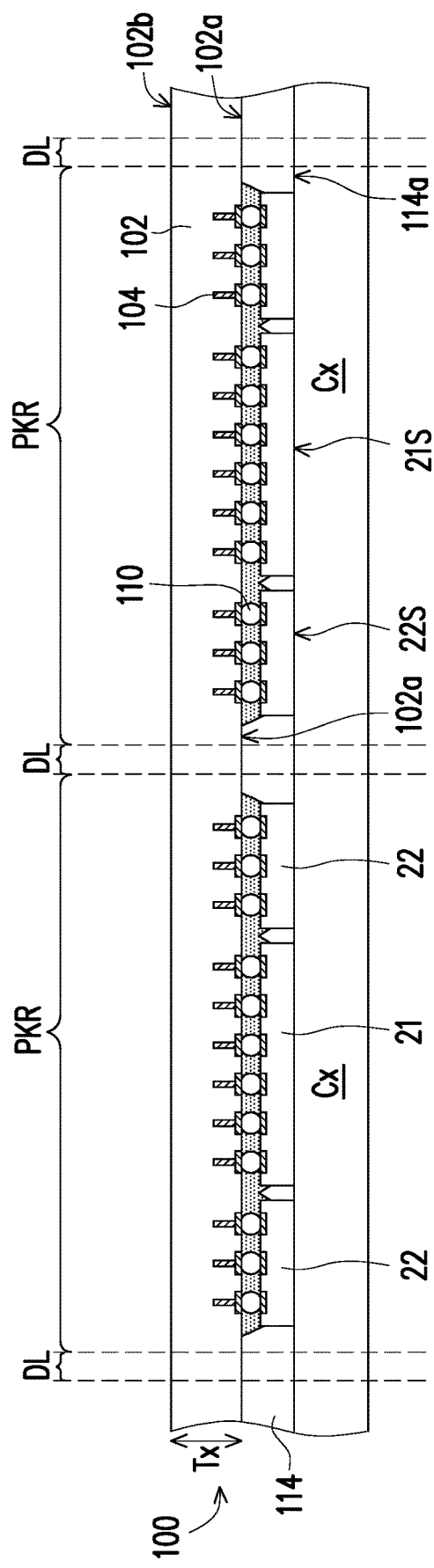

Referring to FIG. 1D, the structure of FIG. 1C is turned upside down or flipped, and placed on a carrier Cx, so that the carrier Cx directly contacts the backside surfaces 21S, 22S of the semiconductor dies 21, 22 and the top surface 114a of the insulating encapsulant 114. As shown in FIG. 1D, at this stage of processing, the interposer structure 100 has not been thinned and has a thickness Tx. In other words, the through vias 104 are not revealed, and are embedded in the core portion 102 of the interposer structure 100.

Figure 1E:
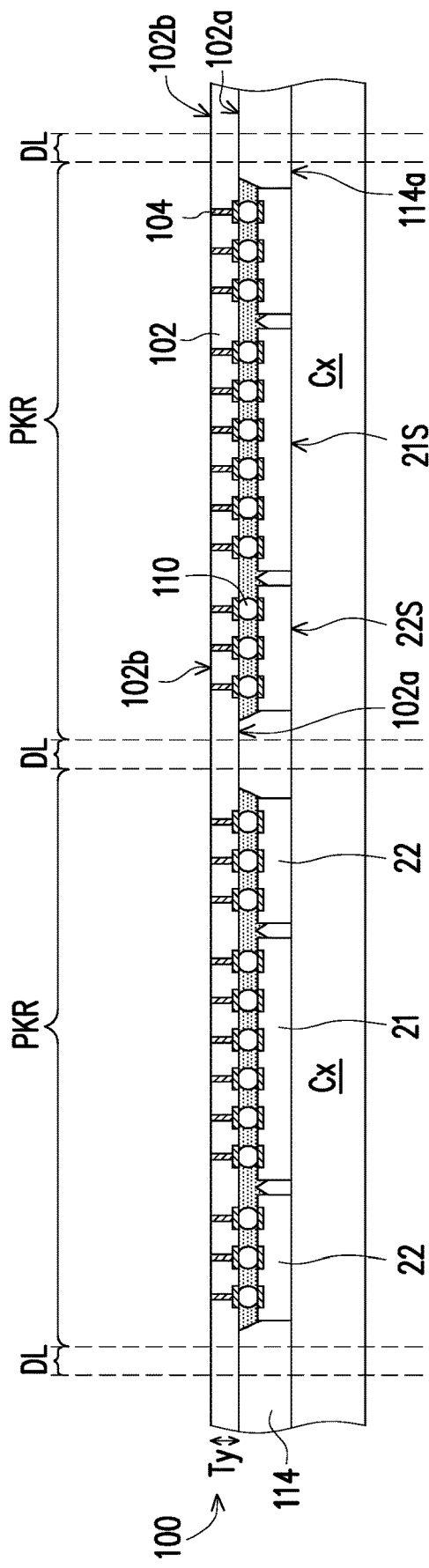

Referring to FIG. 1E, a thinning process is performed to the interposer 100 to partially remove or thin the core portion 102 of the interposer structure 100 until the through vias 104 are exposed and a second surface 102b of the core portion 102 is formed. In some embodiments, the thinning process may include a back-grinding process, a polishing process or an etching process. In some embodiments, after the thinning process, the interposer structure 100 is thinned to a thickness Ty. In some embodiments, a ratio of the thickness Ty to the thickness Tx ranges from about 0.1 to about 0.5.

Figure 1F:
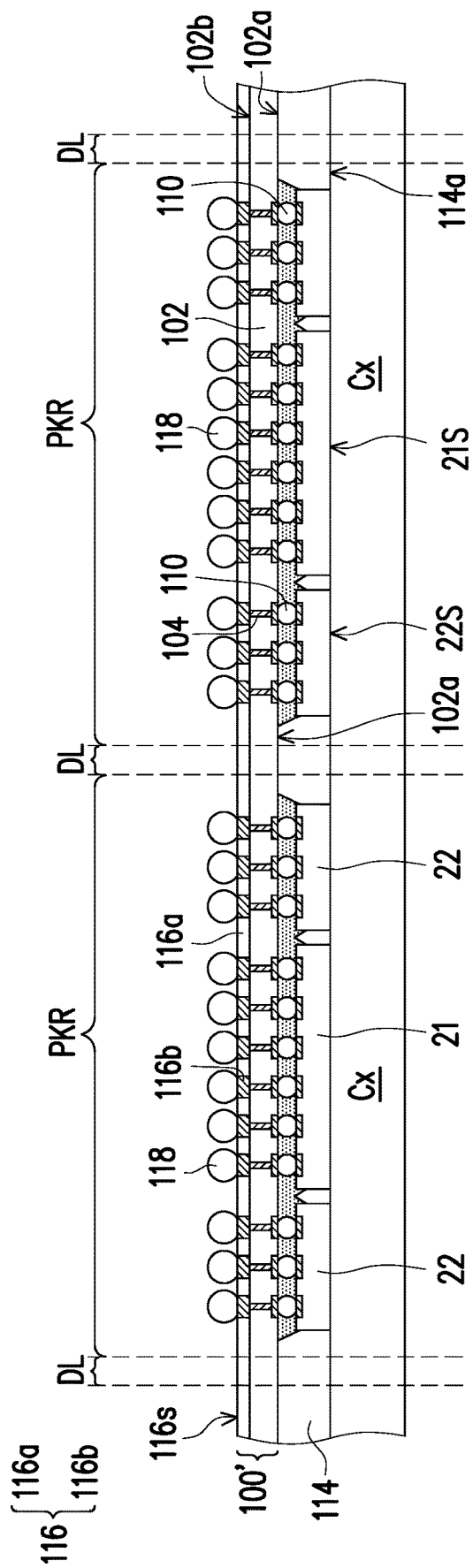

Referring to FIG. 1F, a redistribution structure 116 is formed on the second surface 102b of the core portion 102 in the package region PKR and over the dicing lanes DL. The second surface 102b being opposite to the first surface 102a of the core portion 102. In some embodiments, the redistribution structure 116, the core portion 102, the through vias 104 and conductive pads 106 constitutes the interposer structure 100'. In some embodiments, the redistribution structure 116 electrically connects the through vias 104 and/or electrically connects the through vias 104 with external devices. In certain embodiments, the redistribution structure 116 includes at least one dielectric layer 116a and metallization patterns 116b in the dielectric layer 116a. In some embodiments, the metallization patterns 116b may comprise pads, vias and/or trace lines to interconnect the through vias 104 and to further connect the through vias 104 to one or more external devices. Although one layer of dielectric layer 116a, and one layer of the metallization patterns 116b is shown in FIG. 1F, it should be noted that the number of layers of the dielectric layer 116a and the metallization patterns 116b is not limited thereto, and this could be adjusted based on requirement.

In some embodiments, the material of the dielectric layer 116a comprises silicon oxide, silicon nitride, silicon carbide, silicon oxynitride, or low-K dielectric materials (such as phosphosilicate glass materials, fluorosilicate glass materials, boro-phosphosilicate glass materials, SiOC, spin-on-glass materials, spin-on-polymers or silicon carbon materials). In some embodiments, the dielectric layer 116a is formed by spin-coating or deposition, including chemical vapor deposition (CVD), PECVD, HDP-CVD, or the like. In some embodiments, the metallization patterns 116b include under-metal metallurgies (UBMs). In some embodiments, the formation of the metallization patterns 116b may include patterning the dielectric layer using photolithography techniques and one or more etching processes and filling a metallic material into the openings of the patterned dielectric layer. Any excessive conductive material on the dielectric layer may be removed, such as by using a chemical mechanical polishing process. In some embodiments, the material of the metallization patterns 116b includes copper, aluminum, tungsten, silver, and combinations thereof.

As further illustrated in FIG. 1F, a plurality of conductive terminals 118 is disposed on the metallization patterns 116b, and are electrically coupled to the through vias 104. In some embodiments, the conductive terminals 118 are placed on the top surface 116s of the redistribution structure 116, and electrically connected to the through vias 104 by the metallization patterns 116b within the package region PKR. In certain embodiments, the conductive terminals 118 are positioned on and physically attached to the metallization patterns 116b. In some embodiments, the conductive terminals 118 include lead-free solder balls, solder balls, ball grid array (BGA) balls, bumps, C4 bumps or micro bumps. In some embodiments, the conductive terminals 118 may include a conductive material such as solder, copper, aluminum, gold, nickel, silver, palladium, tin, or a combination thereof. In some embodiments, the conductive terminals 118 are formed by forming the solder paste on the redistribution structure 116 by, for example, evaporation, electroplating, printing or solder transfer and then reflowed into the desired bump shapes. In some embodiments, the conductive terminals 118 are placed on the redistribution structure 116 by ball placement or the like. In other embodiments, the conductive terminals 118 are formed by forming solder-free metal pillars (such as a copper pillar) by sputtering, printing, electroless or electro plating or CVD, and then forming a lead-free cap layer by plating on the metal pillars. The conductive terminals 118 may be used to bond to an external device or an additional electrical component. In some embodiments, the conductive terminals 118 are used to bond to a circuit substrate, a semiconductor substrate or a packaging substrate.

Figure 1G:
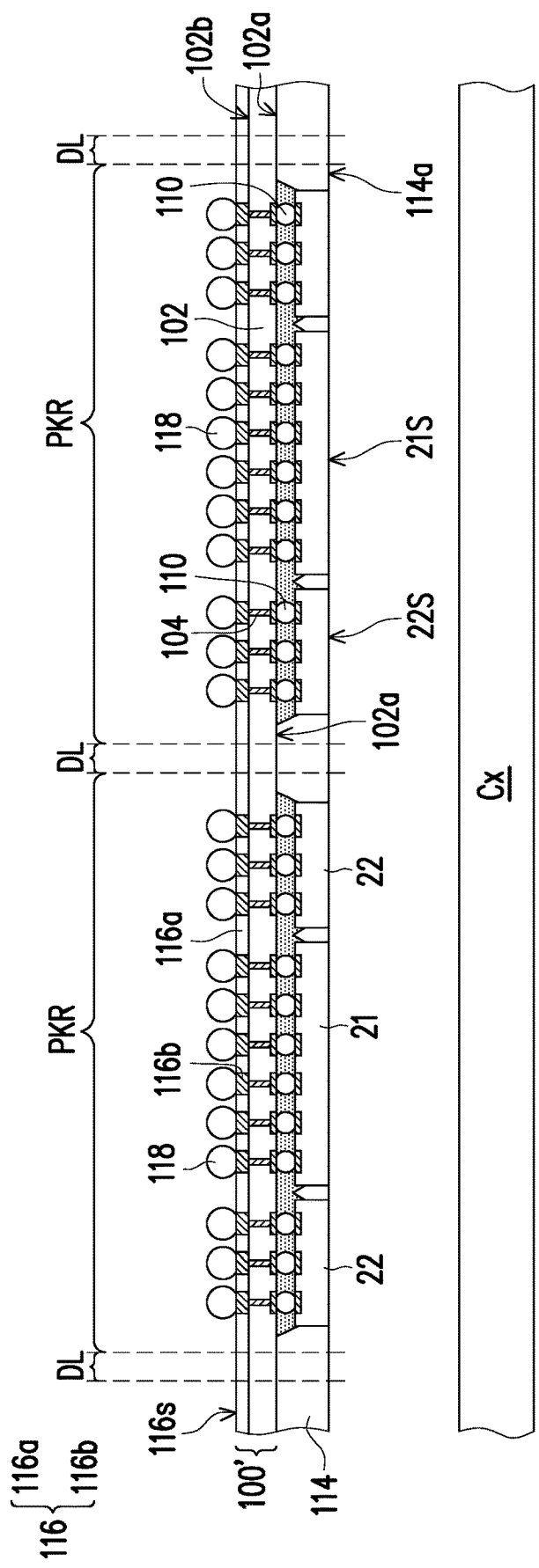

Referring to FIG. 1G, in a subsequent step, the carrier Cx is de-bonded. For example, the de-bonding process includes projecting a light such as a laser light or an UV light on a debond layer (e.g., light-to-heat-conversion release layer) that is attached to the carrier Cx (not shown), so that the carrier Cx can be easily removed along with the debond layer. In some embodiments, the backside surfaces 21S, 22S of the semiconductor dies 21, 22 are revealed after the de-bonding process.

Figure 1H:
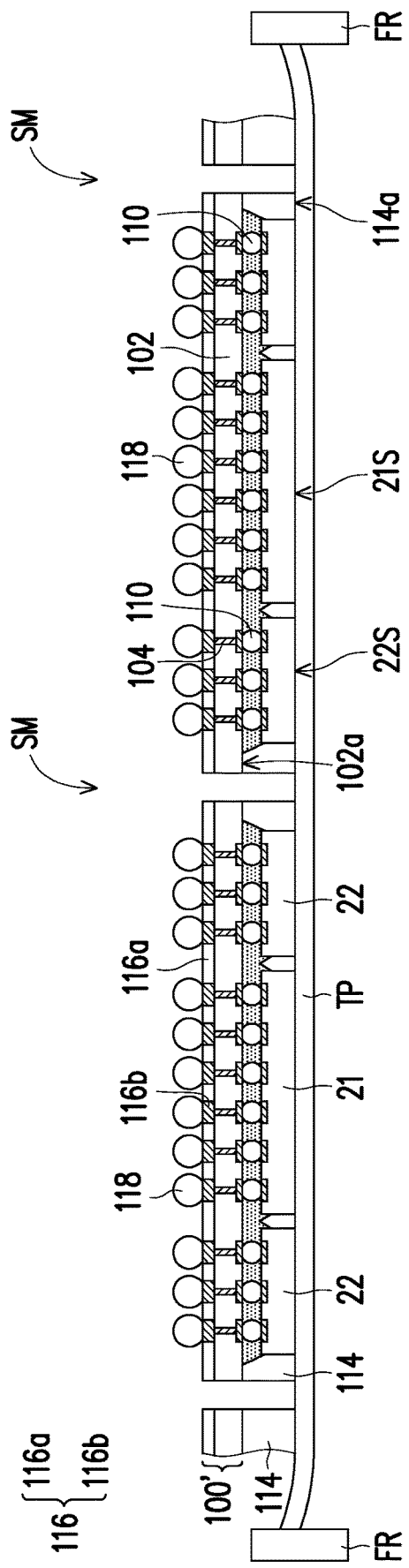

Referring to FIG. 1H, after de-bonding the carrier Cx, the structure shown in FIG. 1G is attached to a tape TP (e.g., a dicing tape) supported by a frame FR. Subsequently, the structure shown in FIG. 1G is diced or singulated along the dicing lanes DL to form a plurality of semiconductor packages SM. For example, the dicing process is performed to cut through the redistribution structure 116, the core portion 102, and the insulating encapsulant 114 to remove portions of the redistribution structure 116, the core portion 102, and the insulating encapsulant 114 along the dicing lanes DL. In some embodiments, the dicing process or the singulation process typically involves dicing with a rotating blade or a laser beam. In other words, the dicing or singulation process is, for example, a laser cutting process, a mechanical sawing process, or other suitable processes. After debonding the carrier Cx, the singulated semiconductor package SM illustrated in FIG. 1I can be obtained.

Figure 1I:
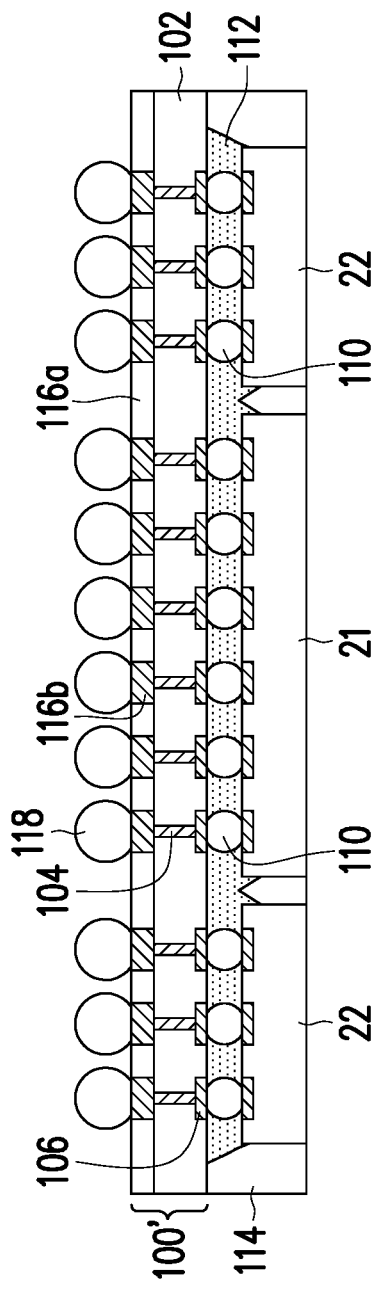
Figure 2:
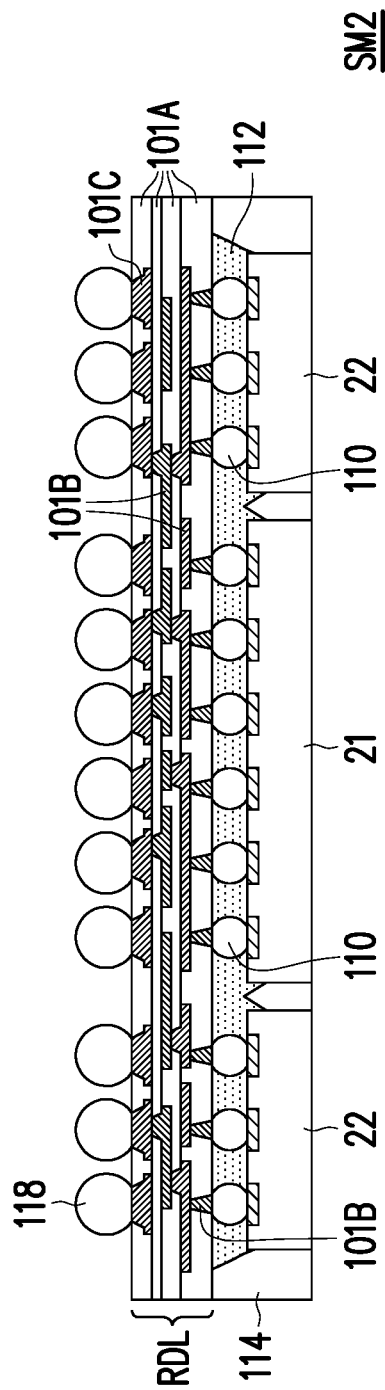
FIG. 2 is a schematic sectional view of a semiconductor package according to some other exemplary embodiments of the present disclosure.

FIG. 2 is a schematic sectional view of a semiconductor package according to some other exemplary embodiments of the present disclosure. The semiconductor package SM2 illustrated in FIG. 2 is similar to the semiconductor package SM illustrated in FIG. 1I. Therefore, the same reference numerals may be used to refer to the same or liked parts, and its detailed description will be omitted herein. The difference between the embodiments is that the interposer structure 100' illustrated in FIG. 1I is replaced with a redistribution layer RDL illustrated in FIG. 2. As illustrated in FIG. 2, the redistribution layer RDL is disposed on the insulating encapsulant 114 and electrically connected to the semiconductor dies 21, 22 through the electrical connectors 110.

In some embodiments, the redistribution layer RDL is formed by sequentially forming one or more dielectric layers 101A and one or more conductive layers 101B in alternation. In certain embodiments, the conductive layers 101B are sandwiched between the dielectric layers 101A, and are electrically and physically connected to the electrical connectors 110. In the exemplary embodiment, the numbers of the dielectric layers 101A and the conductive layers 101B included in the redistribution layer RDL is not limited thereto, and may be designated and selected based on the design requirements. For example, the numbers of the dielectric layers 101A and the conductive layers 101B may be one or more than one.

In some embodiments, the material of the dielectric layers 101A is polyimide, polybenzoxazole (PBO), benzocyclobutene (BCB), a nitride such as silicon nitride, an oxide such as silicon oxide, phosphosilicate glass (PSG), borosilicate glass (BSG), boron-doped phosphosilicate glass (BPSG), a combination thereof or the like, which may be patterned using a photolithography and/or etching process. In some embodiments, the material of the dielectric layers DI1 is formed by suitable fabrication techniques such as spin-on coating, chemical vapor deposition (CVD), plasma-enhanced chemical vapor deposition (PECVD) or the like. The disclosure is not limited thereto.

In some embodiments, the material of the conductive layer 101B is made of conductive materials formed by electroplating or deposition, such as aluminum, titanium, copper, nickel, tungsten, and/or alloys thereof, which may be patterned using a photolithography and etching process. In some embodiments, the conductive layer 101B may be patterned copper layers or other suitable patterned metal layers. Throughout the description, the term "copper" is intended to include substantially pure elemental copper, copper containing unavoidable impurities, and copper alloys containing minor amounts of elements such as tantalum, indium, tin, zinc, manganese, chromium, titanium, germanium, strontium, platinum, magnesium, aluminum or zirconium, etc.

In certain embodiments, the redistribution layer RDL further includes a plurality of conductive pads 101C disposed on the conductive layers 101B for electrically connecting with conductive terminals 118. In some embodiments, the materials of the conductive pads 101C may include copper, nickel, titanium, tungsten, or alloys thereof or the like, and may be formed by an electroplating process, for example. The number of conductive pads 101C are not limited in this disclosure, and may be selected based on the design layout. In some alternative embodiments, the conductive pads 101C may be omitted. In other words, the conductive terminals 118 formed in subsequent steps may be directly disposed on the conductive layers 101B of the redistribution layer RDL.

Figure 3A:
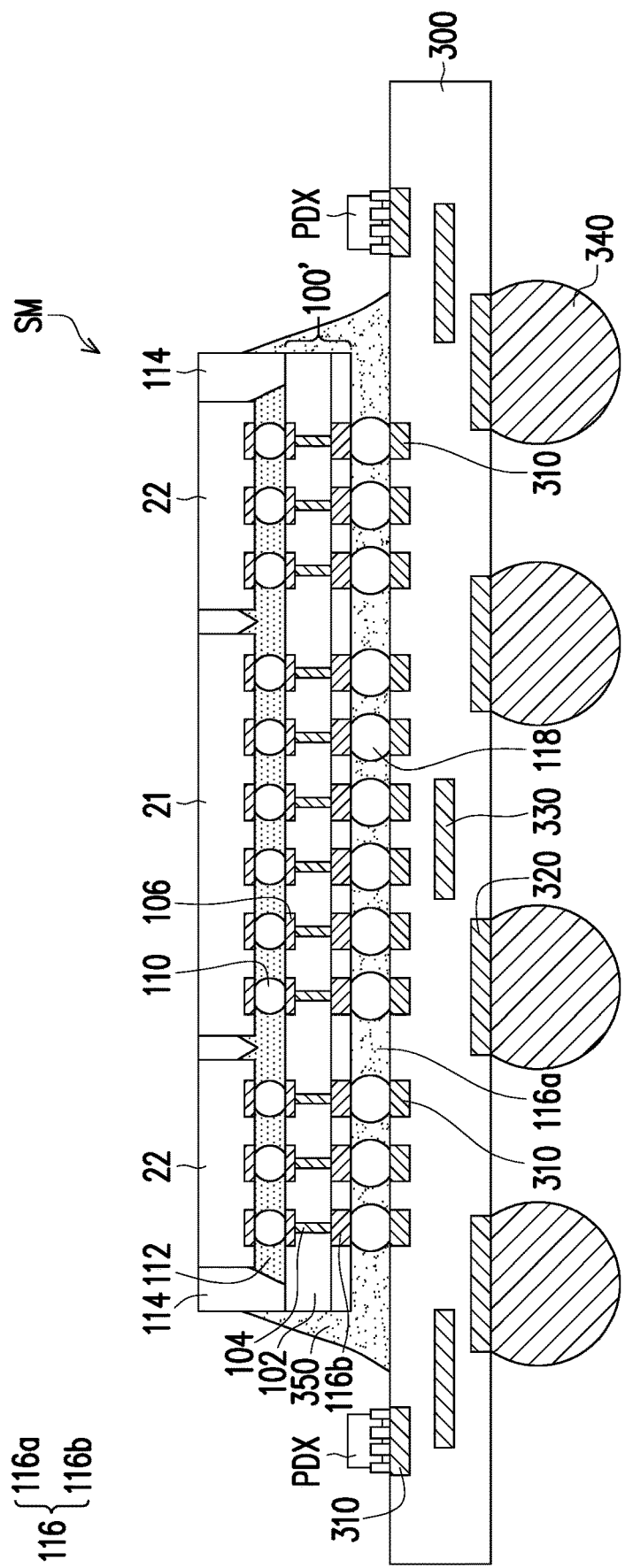
FIG. 3A to FIG. 3D are schematic top and sectional views of various stages in a method of fabricating a package structure according to some exemplary embodiments of the present disclosure.

FIG. 3A to FIG. 3D are schematic top and sectional views of various stages in a method of fabricating a package structure according to some exemplary embodiments of the present disclosure. Referring to FIG. 3A, in some embodiments, the semiconductor package SM obtained in FIG. 1H is mounted or attached onto a circuit substrate 300 through the conductive terminals 118. In some embodiments, the circuit substrate 300 includes contact pads 310, contact pads 320, metallization layers 330, and vias (not shown). In some embodiments, the contact pads 310 and the contact pads 320 are respectively distributed on two opposite sides of the circuit substrate 300, and are exposed for electrically connecting with later-formed elements/features. In some embodiments, the metallization layers 330 and the vias are embedded in the circuit substrate 300 and together provide routing function for the circuit substrate 300, wherein the metallization layers 330 and the vias are electrically connected to the contact pads 310 and the contact pads 320. In other words, at least some of the contact pads 310 are electrically connected to some of the contact pads 320 through the metallization layers 330 and the vias. In some embodiments, the contact pads 310 and the contact pads 320 may include metal pads or metal alloy pads. In some embodiments, the materials of the metallization layers 330 and the vias may be substantially the same or similar to the material of the contact pads 310 and the contact pads 320.

Furthermore, in some embodiments, the semiconductor package SM is bonded to the circuit substrate 300 through physically connecting the conductive terminals 118 and the contact pads 310 to form a stacked structure. In certain embodiments, the semiconductor package SM is electrically connected to the circuit substrate 300. In some embodiments, the circuit substrate 300 is such as an organic flexible substrate or a printed circuit board. In such embodiments, the conductive terminals 118 are, for example, chip connectors. In some embodiments, a plurality of conductive balls 340 are respectively formed on the substrate 300. As illustrated in FIG. 3A, for example, the conductive balls 340 are connected to the contact pads 320 of the circuit substrate 300. In other words, the conductive balls 340 are electrically connected to the circuit substrate 300 through the contact pads 320. Through the contact pads 310 and the contact pads 320, some of the conductive balls 340 are electrically connected to the semiconductor package SM (e.g. the semiconductor dies 21 and 22 included therein). In some embodiments, the conductive balls 340 are, for example, solder balls or BGA balls. In some embodiments, the semiconductor package SM is bonded to the circuit substrate 300 through physically connecting the conductive terminals 118 and the contact pads 310 of the circuit substrate 300 by a chip on wafer on substrate (CoWoS) packaging processes. In addition, as illustrated in FIG. 3A, passive devices PDx (integrated passive device or surface mount devices) may be mounted on the circuit substrate 300. For example, the passive devices PDx may be mounted on the contact pads 310 of the circuit substrate 300 through a soldering process. The disclosure is not limited thereto. In certain embodiments, the passive devices PDx may be mounted on the circuit substrate surrounding the semiconductor package SM. In some alternative embodiments, the passive devices PDx are omitted.

As further illustrated in FIG. 3A, in some embodiments, an underfill structure 350 is formed to fill up the spaces in between the circuit substrate 300 and the semiconductor package SM. In certain embodiments, the underfill structure 350 fills up the spaces in between adjacent conductive terminals 118 and covers the conductive terminals 118. For example, the underfill structure 350 surrounds the plurality of conductive terminals 118. In some embodiments, the passive devices PDx is exposed by the underfill structure 350, and kept a distance apart from the underfill structure 350. In other words, the underfill structure 350 does not cover the passive devices PDx.

Figure 3B:
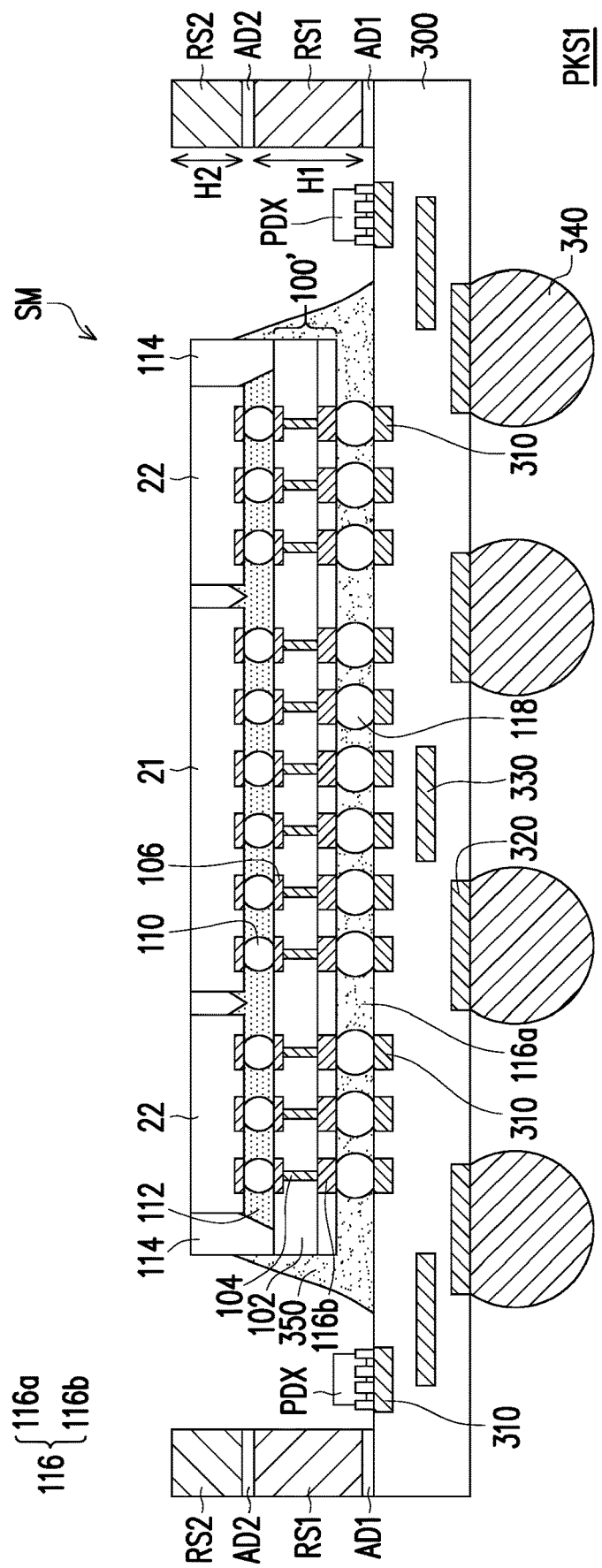

Referring to FIG. 3B, in a subsequent step, a first ring structure RS1 (first stiffener ring) is attached to the circuit substrate 300 through a first adhesive AD1, and a second ring structure RS2 (second stiffener ring) is attached to the first ring structure RS2 through a second adhesive AD2. The first ring structure RS1 may surround the interposer structure 100' and partially surround the insulating encapsulant 114, while the second ring structure RS2 may partially surround the insulating encapsulant 114 and the semiconductor dies 21, 22. In some embodiments, depending on the thicknesses of the semiconductor dies 21, 22, the first ring structure RS1 may also be partially surrounding the semiconductor dies 21, 22.

In some embodiments, the first ring structure RS1 is made of a material having a smaller coefficient of thermal expansion (CTE) than a material of the second ring structure RS2. In some embodiments, the first ring structure RS1 and the second ring structure RS2 are both formed of a metallic material. For example, in one embodiment, the first ring structure RS1 is made of stainless steel 304SS, and the second ring structure RS2 is made of stainless steel 430SS. The disclosure is not limited thereto. After attaching the first ring structure RS1 and the second ring structure RS2 onto the circuit substrate 300, a package structure PKS1 according to some embodiments of the present disclosure may be accomplished.

Figure 3C:
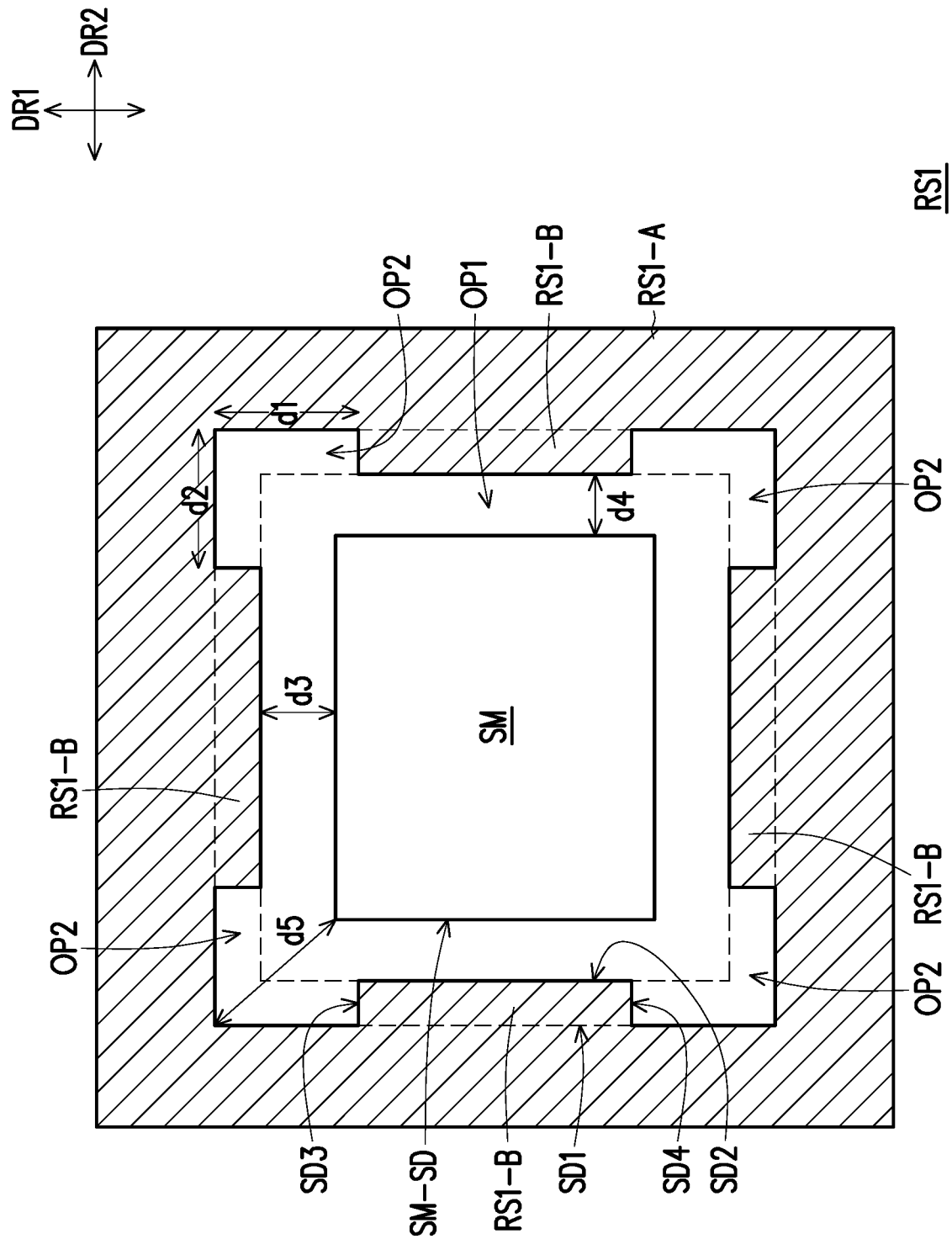
Figure 3D:
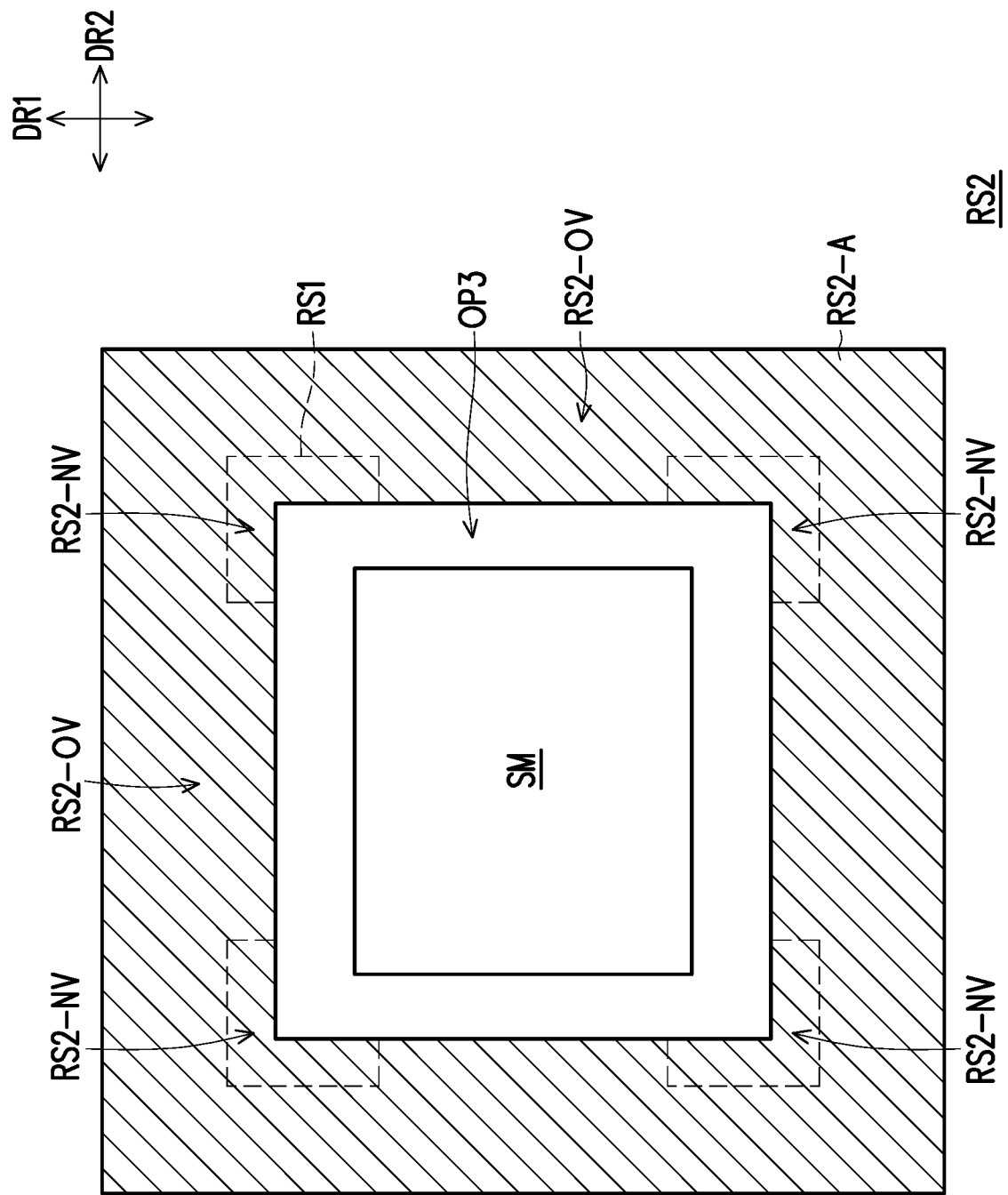

The first ring structure RS1 and the second ring structure RS2 will be described in more details by referring to the top views illustrated in FIG. 3C and FIG. 3D. FIG. 3C illustrates a top view of the first ring structure RS1, while FIG. 3D illustrates a top view of the second ring structure RS2. In the top views from FIG. 3C and FIG. 3D, the underfill structure 350 and the passive devices PDx are omitted for ease of illustration.

As shown in FIG. 3B and FIG. 3C, in some embodiments, the first ring structure RS1 (first stiffener ring) is attached to the circuit substrate 300 and surrounding the semiconductor package SM. Furthermore, the first ring structure RS1 is located in between the circuit substrate 300 and the second ring structure RS2. In some embodiments, the first ring structure RS1 includes a central opening OP1 and a plurality of corner openings OP2 extending out from corners of the central opening OP1. In some embodiments, the central opening OP1 of the first ring structure RS1 is a square-shaped or rectangular-shaped opening having four corners, and corner digging is performed at the four corners to form the plurality of corner openings OP2. In other words, the corner openings OP2 are joined with the central opening OP1, and extends out from the four corners of the square-shaped or rectangular-shaped central opening OP1. In certain embodiments, the corner openings OP2 has a polygonal outline. For example, in the exemplary embodiment, corner digging is performed with a square-shaped outline at a position overlapped with the four corners of the central opening OP1 to form the corner openings OP2.

In some embodiments, the semiconductor package SM is located in the central opening OP1, and the plurality of corner openings OP2 is surrounding the corners of the semiconductor package SM. For example, the semiconductor package SM is encircled by the central opening OP1 and the corner openings OP2 of the first ring structure RS1. In some embodiments, each of the corner openings OP2 has a first width d1 extending in a first direction DR1 and a second width d2 extending in a second direction DR2. For example, the first direction DR1 is perpendicular to the second direction DR2, and the first width d1 is substantially equal to the second width d2. Furthermore, the first width d1 and the second width d2 do not extend beyond a ring foot (outer corners) of the first ring structure RS1. That is, a continuous ring-like structure is formed by the first ring structure RS1.

In some embodiments, the semiconductor package SM is spaced apart from a boundary of the central opening OP1 by a distance d3 and a distance d4. In some embodiments, the distance d3 is measured in the first direction DR1 and the distance d4 is measured in the second direction DR2. In some embodiments, the distance d3 and the distance d4 is the minimum distance from the corresponding sidewall of the semiconductor package SM to the corresponding inner sidewall of the central opening OP1. The distance d3 may be substantially equal to the distance d4, or may be greater than or smaller than distance d4, and this may be adjusted based on design requirements. Furthermore, in certain embodiments, the distance d3 is smaller than the first width d1, while the distance d4 is smaller than the second width d2.

In some embodiments, a minimum distance (distance d3 or distance d4) of the semiconductor package SM to a boundary of the central opening OP1 is smaller than a maximum distance d5 from the corners of the semiconductor package SM to a boundary of corner openings OP2. In some embodiments, the maximum distance d5 may extend from the corners of the semiconductor package SM to a region that is slightly larger than the corners of the central openings OP1, or to a region that is slightly smaller than a ring foot (outer corners) of the first ring structure RS1. In certain embodiments, when the minimum distance of a first sidewall of the semiconductor package SM to an inner sidewall of the first ring structure RS1 is distance d3, a minimum distance of a second sidewall of the semiconductor package SM to an inner sidewall of the first ring structure RS1 is distance d4, then a maximum distance d5 from a corner of the semiconductor package SM to an inner corner of the first ring structure RS1 satisfy the following relationship: $d5 > \sqrt{(d3)^2 + (d4)^2}$. In other words, the maximum distance d5 may be appropriately adjusted as long as it extends over the corners of the central opening OP1 and does not extend beyond the ring foot (outer corners) of the first ring structure RS1. By controlling the dimensions and relative distances of the central opening OP1 and the corner openings OP2, a molding stress in the semiconductor package SM may be significantly reduced.

As further illustrated in FIG. 3B and FIG. 3C, in some embodiments the first ring structure RS1 (first stiffener ring) includes a frame portion RS1-A and a plurality of protruding parts RS1-B extending out from inner surfaces of the frame portion RS1-A towards the semiconductor package SM. For example, the frame portion RS1-A is a ring-shaped structure, and the plurality of protruding parts RS1-B are separated from one another while being attached to the inner surface of the frame portion RS1-A. In certain embodiments, each of the protruding parts RS1-B are extending towards the interposer structure 100' of the semiconductor package SM. The design and shape of the frame portion RS1-A and the plurality of protruding parts RS1-B defines an outline of the central opening OP1 and corner openings OP2.

In some embodiments, each of the protruding parts RS1-B includes a first side SD1, a second side SD2, a third side SD3 and a fourth side SD4. For example, the first side SD1 is joined with the frame portion RS1-A. The second side SD2 is opposite to the first side SD1, wherein the second side SD1 includes a planar surface that is parallel to a side surface SM-SD of the interposer structure 100' (of the semiconductor package SM). Furthermore, the third side SD3 and the fourth side SD4 are respectively joining the second side SD2 to the first side SD1. In the exemplary embodiment, the first side SD1, the second side SD2, the third side SD3 and the fourth side SD4 of each of the protruding parts RS1-B are joined together to form a rectangular outline. However, the disclosure is not limited thereto, and the outline of the protruding parts RS1-B may be adjusted based on design requirements. By designing the first ring structure RS1 to include the plurality of protruding parts RS1-B facing the side surface SM-SD of the interposer structure 100', the molding stress located at corners of the semiconductor package SM may be significantly reduced.

Referring to FIG. 3B and FIG. 3D, the second ring structure RS2 (second stiffener ring) is attached to the first ring structure RS1 to surround the semiconductor package SM. In some embodiments, the second ring structure RS2 includes a second central opening OP3 that is overlapped with the central opening OP1 of the first ring structure RS1. In some embodiments, an outline of the central opening OP1 of the first ring structure RS1 is substantially equal to an outline of the second central opening OP3 of the second ring structure RS2. That is, the second central opening OP3 is a square-shaped or rectangular-shaped opening having four corners (without corner digging).

Furthermore, the second ring structure RS2 includes a second frame portion RS2-A with an overlapping part RS2-OV and non-overlapping parts RS2-NV. For example, the overlapping part RS2-OV of the second frame portion RS2-A is overlapped with the frame portion RS1-A and the plurality of protruding parts RS1-B of the first ring structure RS1, whereas the non-overlapping parts RS2-NV of the second frame portion RS2-A are located at four inner corners of the second stiffener ring RS2. In some embodiments, the non-overlapping parts RS2-NV of the second frame portion RS2-A corresponds to a position of the corner openings OP2 of the first ring structure RS1. In some embodiments, the first ring structure RS1 has a first thickness H1, while the second ring structure RS2 has a second thickness H2. In one embodiment, the first thickness H1 is greater than the second thickness H2. For example, a ratio of the first thickness H1 to the second thickness H2 may be in a range of 1.1:1 to 1.8:1. However, the disclosure is not limited thereto, and the first thickness H1 and the second thickness H2 may be adjusted based on product requirements. In some alternative embodiment, the second thickness H2 is greater than the first thickness H1.

In the exemplary embodiment, the first ring structure RS1 and the second ring structure RS1 may have a thickness that sums up to be substantially equal to or greater than a height of the semiconductor package SM on the circuit substrate 300. However, the disclosure is not limited thereto, and their thicknesses may be appropriately adjusted. Furthermore, the first ring structure RS1 and the second ring structure RS2 may together serve to reduce the warpage on the circuit substrate 300 caused by bonding of the semiconductor package SM thereto. In addition, the semiconductor package SM will be constrained by the first and second ring structures RS1, RS2 to control the interfacial stress while reducing the internal stress of the semiconductor package SM. Overall, the package structure PKS1 including the first and second ring structures RS1, RS2 will have improved reliability.

FIG. 4 to FIG. 8 are top views of a first ring structure in accordance with various embodiments of the present disclosure. In various embodiments, the design of the first ring structure RS1 shown in FIG. 3C may be adjusted according to FIG. 4 to FIG. 8, all of these designs can help to reduce a molding stress in the semiconductor package SM. The various designs of the first ring structure RS1 illustrated in FIG. 4 to FIG. 8 may be similar to the first ring structure RS1 illustrated in FIG. 3C. Therefore, the same reference numerals are used to refer to the same or liked parts, and its detailed description will be omitted herein.

Figure 4:
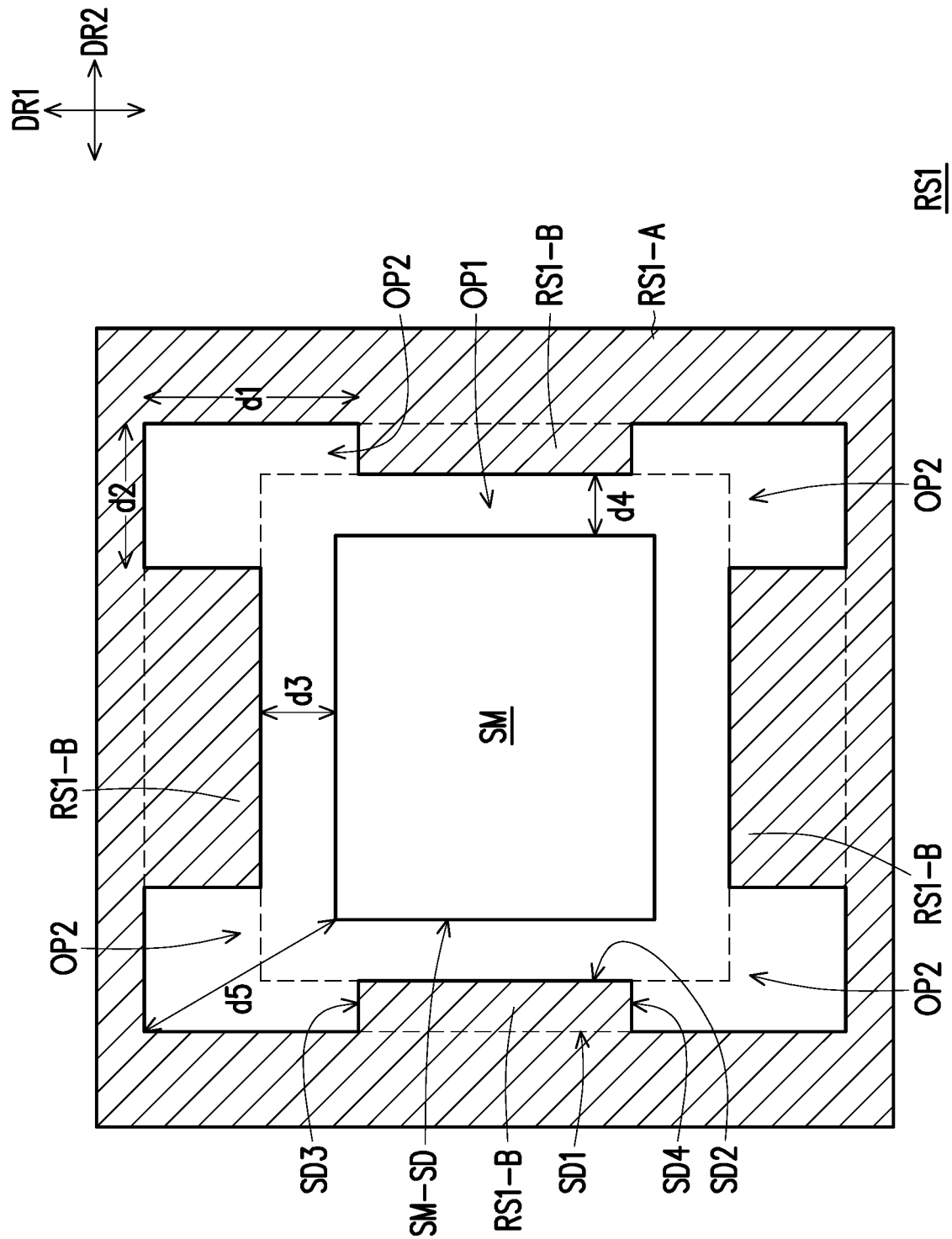
FIG. 4 to FIG. 8 are top views of a first ring structure in accordance with various embodiments of the present disclosure.

Referring to FIG. 4, the difference between the first ring structure RS1 shown in FIG. 3C and the first ring structure RS1 shown in FIG. 4 is in the design of the corner openings OP2. For example, the corner openings OP2 of FIG. 3C has a first width d1 that is substantially equal to the second width d2. However, the disclosure is not limited thereto. Referring to FIG. 4, the first width d1 may be adjusted to be greater than the second width d2. Alternatively, in some other embodiments, the first width d1 may be adjusted to be smaller than the second width d2. In other words, the dimensions of the first width d1 and the second width d2 of the corner openings OP2 may be adjusted based on design requirements.

Figure 5:
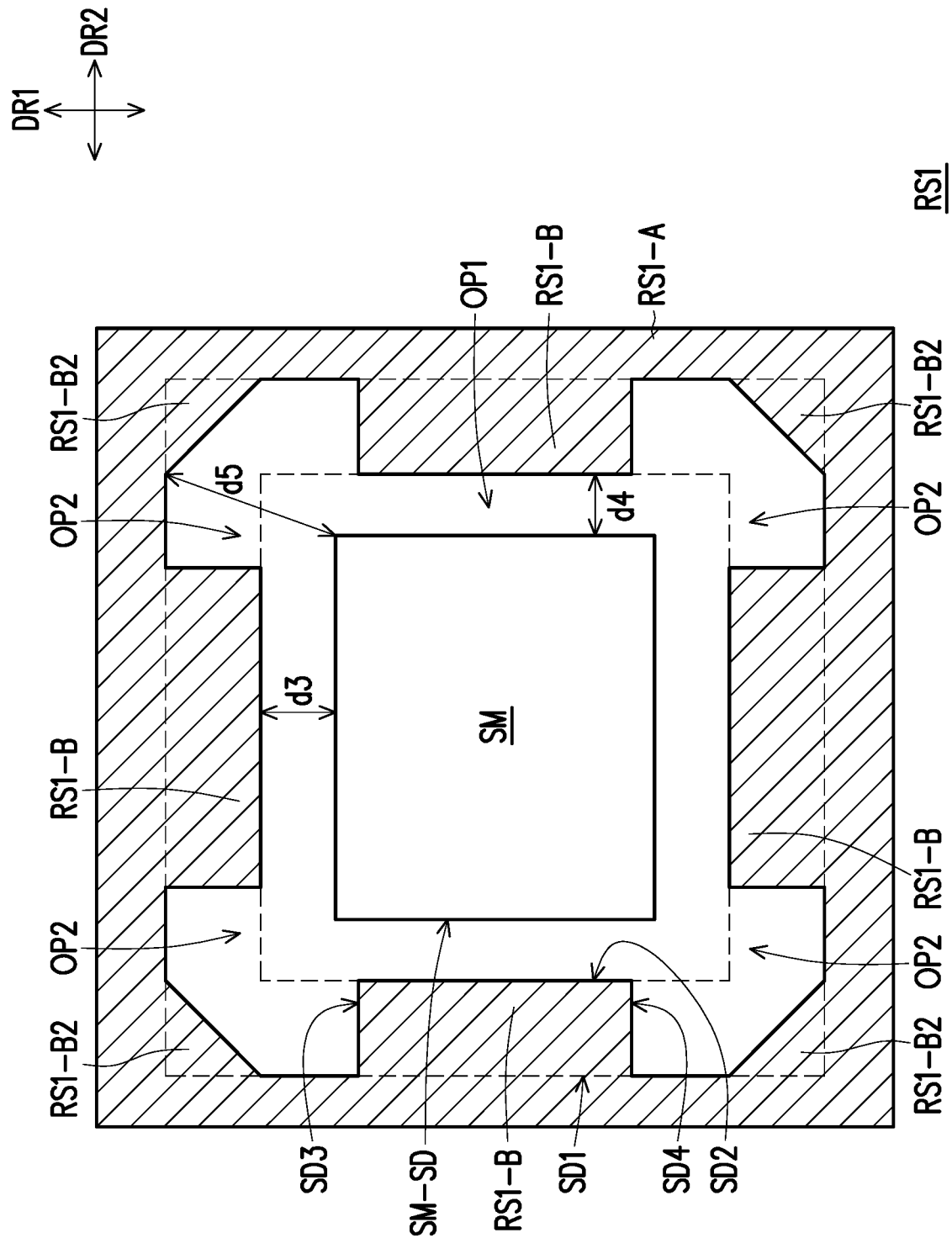

Referring to FIG. 5, the difference between the first ring structure RS1 shown in FIG. 3C and the first ring structure RS1 shown in FIG. 5 is in the shape of the corner openings OP2. For example, as illustrated in FIG. 5, the corner openings OP2 has a polygonal outline. In the exemplary embodiment, corner digging is performed with a hexagonal shaped outline at a position overlapped with the four corners of the central opening OP1 to form the corner openings OP2. In addition, as illustrated in FIG. 5, besides having a frame portion RS1-A and a plurality of protruding parts RS1-B, the first ring structure RS1 may further include a plurality of corner parts RS1-B2 located at the four corners of the frame portion RS1-A, and joined with the frame portion RS1-A. In some embodiments, the corner parts RS1-B2 are physically separated from the protruding parts RS1-B.

Figure 6:
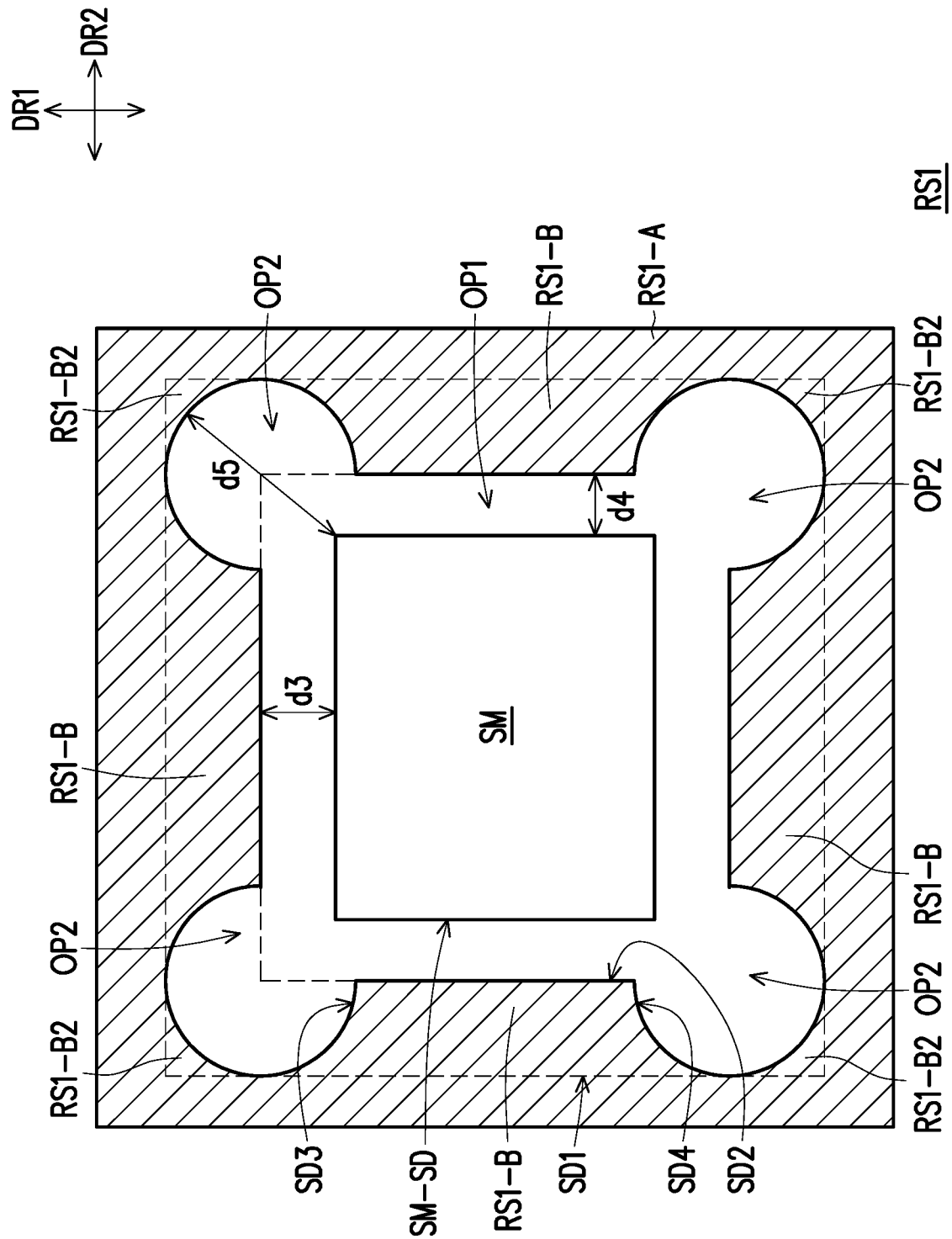

Referring to FIG. 6, the difference between the first ring structure RS1 shown in FIG. 3C and the first ring structure RS1 shown in FIG. 6 is in the shape of the corner openings OP2. For example, as illustrated in FIG. 6, the corner openings OP2 has a curved outline. In the exemplary embodiment, corner digging is performed with a circular shaped outline at a position overlapped with the four corners of the central opening OP1 to form the corner openings OP2. Furthermore, as illustrated in FIG. 6, in some embodiments, each of the protruding parts RS1-B includes the first side SD1, the second side SD2, the third side SD3 and the fourth side SD4, whereby the third side SD3 and the fourth side SD have curved surfaces. In some embodiments, besides having a frame portion RS1-A and a plurality of protruding parts RS1-B, the first ring structure RS1 may further include a plurality of corner parts RS1-B2 located at the four corners of the frame portion RS1-A, and joined with the frame portion RS1-A. In some embodiments, the corner parts RS1-B2 are physically separated from the protruding parts RS1-B.

Figure 7:
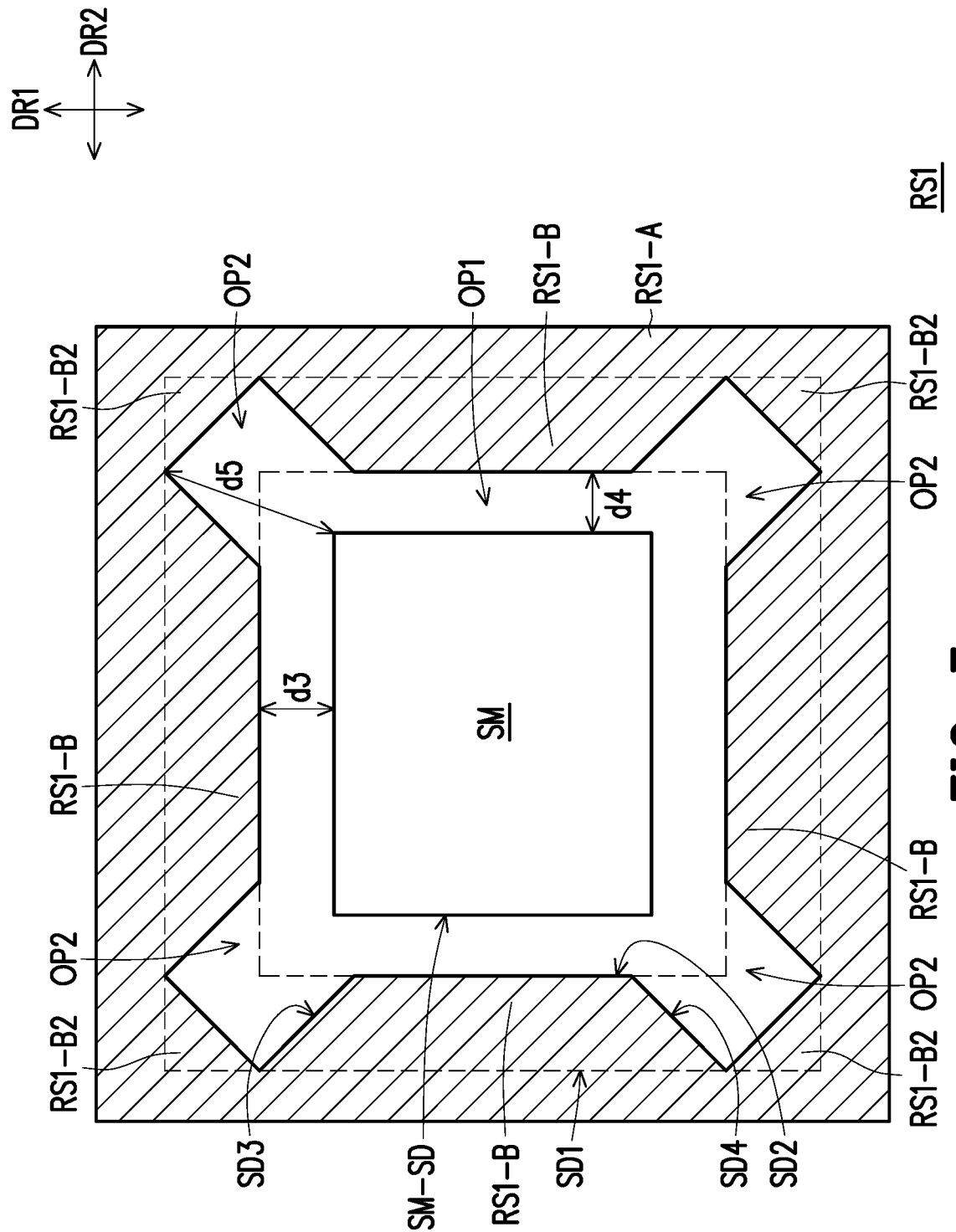

Referring to FIG. 7, the difference between the first ring structure RS1 shown in FIG. 3C and the first ring structure RS1 shown in FIG. 7 is in the design of the corner openings OP2. For example, as illustrated in FIG. 7, the corner openings OP2 has a polygonal outline. In the exemplary embodiment, corner digging is performed with a squared-shaped outline at approximately 45 degrees angle relative to the first direction DR1 or the second direction DR2 (i.e. the square shape is turned 45 degrees during corner digging), at a position overlapped with the four corners of the central opening OP1 to form the corner openings OP2. Furthermore, in some embodiments, each of the protruding parts RS1-B includes the first side SD1, the second side SD2, the third side SD3 and the fourth side SD4, whereby the four sides (SD1, SD2, SD3 and SD4) are joined together to form a trapezoidal outline. In addition, in some embodiments, besides having a frame portion RS1-A and a plurality of protruding parts RS1-B, the first ring structure RS1 may further include a plurality of corner parts RS1-B2 located at the four corners of the frame portion RS1-A, and joined with the frame portion RS1-A. In some embodiments, the corner parts RS1-B2 are physically separated from the protruding parts RS1-B.

Figure 8:
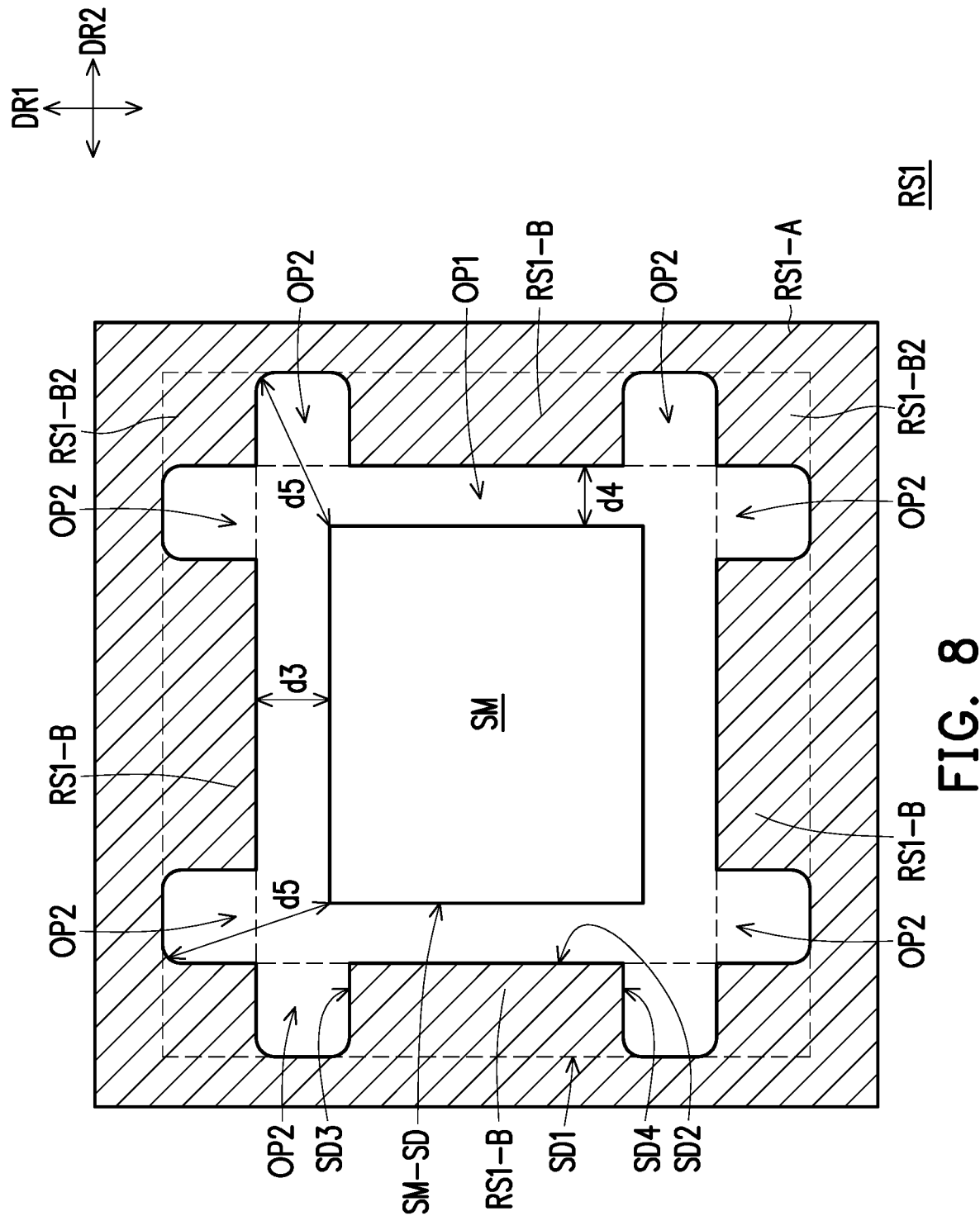

Referring to FIG. 8, the difference between the first ring structure RS1 shown in FIG. 3C and the first ring structure RS1 shown in FIG. 8 is in the number and design of the corner openings OP2. As illustrated in FIG. 8, the corner openings OP2 has a square-shaped outline with rounded corners. In the exemplary embodiment, corner digging is performed with a square-shaped outline with rounded corners at a position aligned with the sides of the four corners of the central opening OP1 to form the plurality of corner openings OP2. For example, in the illustrated embodiment, two corner openings OP2 are extending out from the four corners of the central opening OP1. Similar to the previous embodiments, besides having a frame portion RS1-A and a plurality of protruding parts RS1-B, the first ring structure RS1 may further include a plurality of corner parts RS1-B2 located at the four corners of the frame portion RS1-A, and joined with the frame portion RS1-A. In some embodiments, the corner parts RS1-B2 are physically separated from the protruding parts RS1-B.

Based on the embodiments shown in FIG. 4 to FIG. 8, it is noted that the design of the corner openings OP2 may be adjusted based on design requirements. For example, various ways of corner digging may be performed to form the corner openings OP2 with polygonal outline, curved outline, or with irregular outlines. By forming the corning openings OP2 at corners of the central opening OP1, the molding stress in the semiconductor package SM may be significantly reduced.

Figure 9:
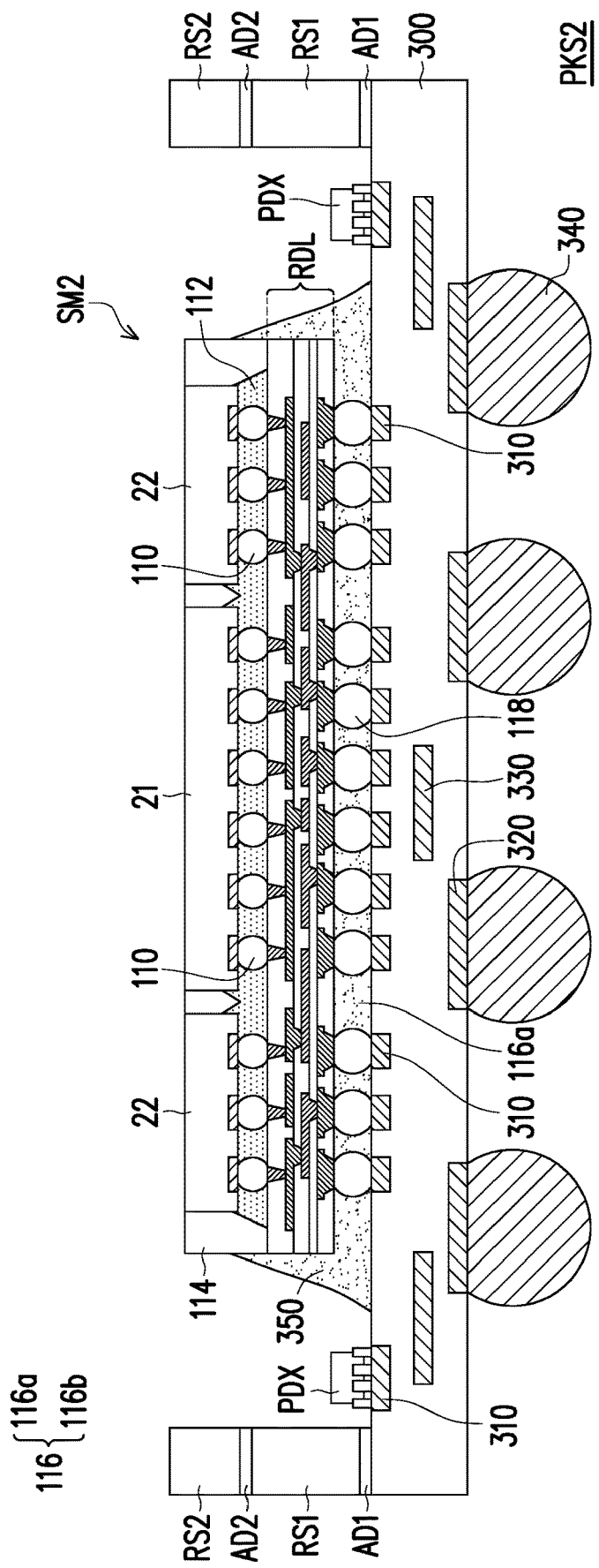
FIG. 9 is a schematic sectional view of a package structure according to some exemplary embodiments of the present disclosure.

FIG. 9 is a schematic sectional view of a package structure according to some exemplary embodiments of the present disclosure. The package structure PKS2 illustrated in FIG. 9 is similar to the package structure PKS1 illustrated in FIG. 3B. Therefore, the same reference numerals are used to refer to the same or liked parts, and its detailed description will be omitted herein. The difference between the embodiments is that the semiconductor package SM2 is used in replacement of the semiconductor package SM in FIG. 9. The details of the semiconductor package SM2 may be referred to the descriptions of FIG. 2, thus will not be repeated herein. In the previous embodiments, the various designs of the first ring structure RS1 are applied to the semiconductor package SM as examples. However, the disclosure is not limited thereto. For example, the various designs of the first ring structure RS1 may be applied to surround the semiconductor package SM2 to reduce a molding stress thereof. In some embodiments, the first ring structure RS1 may surround the redistribution layer RDL and partially surround the insulating encapsulant 114, while the second ring structure RS2 may partially surround the insulating encapsulant 114 and the semiconductor dies 21, 22.

Figure 10:
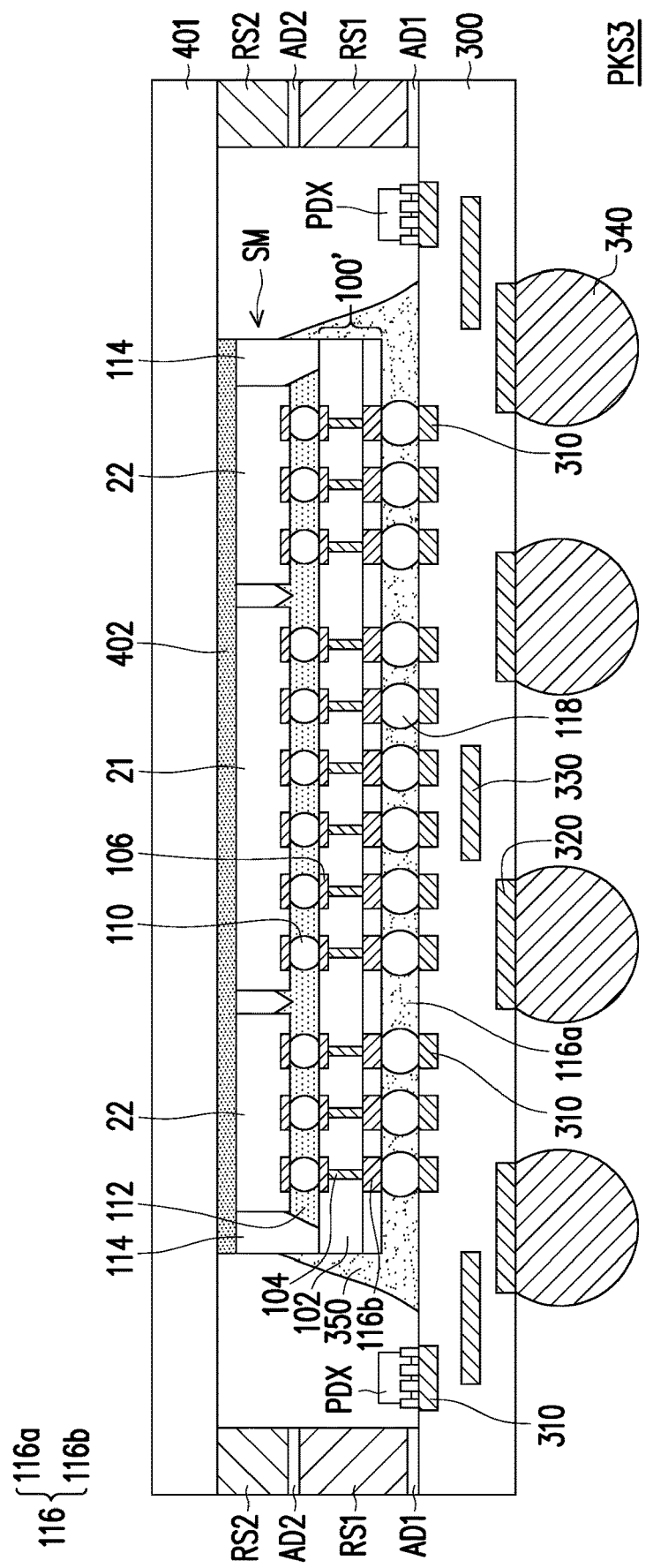
FIG. 10 is a schematic sectional view of a package structure according to some other exemplary embodiments of the present disclosure.

FIG. 10 is a schematic sectional view of a package structure according to some other exemplary embodiments of the present disclosure. The package structure PKS3 illustrated in FIG. 10 is similar to the package structure PKS1 illustrated in FIG. 3B. Therefore, the same reference numerals are used to refer to the same or liked parts, and its detailed description will be omitted herein. The difference between the embodiments is that a lid structure 401 is further provided in FIG. 10. Referring to FIG. 10, in some embodiments, the lid structure 401 may be attached to the second ring structure RS2 through a third adhesive (not shown). The lid structure 401 may cover the semiconductor package SM, so that the semiconductor package SM is located in between the lid structure 401 and the circuit substrate 300. In some embodiments, when the lid structure 401 is provided, a thermal interface metal 402 is further attached on a backside of the semiconductor package SM. In certain embodiments, the thermal interface metal 402 is sandwiched in between the lid structure 401 and the semiconductor package SM, and fills up the space therebetween to enhance the heat dissipation.

In the above-mentioned embodiments, the package structure includes at least a first ring structure (first stiffener ring) and a second ring structure (second stiffener ring) disposed on the circuit substrate surrounding the semiconductor package. The first ring structure is designed to include central openings and a plurality of corner openings formed by corner digging. By designing the first ring structure in such a way, the molding stress at corners of the semiconductor package may be significantly reduced, while the warpage of the package structure is appropriately controlled. Overall, a risk of molding crack or delamination may be prevented, and the reliability of the package structure may be improved.

In accordance with some embodiments of the present disclosure, a package structure includes a circuit substrate, a semiconductor package, and a first ring structure. The semiconductor package is disposed on and electrically connected to the circuit substrate. The first ring structure is attached to the circuit substrate and surrounding the semiconductor package, wherein the first ring structure includes a central opening and a plurality of corner openings extending out from corners of the central opening, the semiconductor package is located in the central opening, and the plurality of corner openings is surrounding corners of the semiconductor package.

In accordance with some other embodiments of the present disclosure, a package structure includes a circuit substrate, an interposer structure, a first semiconductor die and a plurality of second semiconductor dies, an insulating encapsulant, a first stiffener ring and a second stiffener ring. The interposer structure is disposed on and electrically connected to the circuit substrate. The first semiconductor die and the second semiconductor dies are disposed on a backside surface of the interposer structure and electrically connected to the interposer structure. The insulating encapsulant is disposed on the backside surface of the interposer structure and surrounding the first semiconductor die and the plurality of second semiconductor dies. The first stiffener ring and the second stiffener ring are attached to the circuit substrate, wherein the first stiffener ring is located in between the circuit substrate and the second stiffener ring, and the interposer structure, the first semiconductor die and the plurality of second semiconductor dies are encircled by the first stiffener ring and the second stiffener ring. The first stiffener structure includes a frame portion and a plurality of protruding parts extending out from inner surfaces of the frame portion towards the interposer structure, and each of the plurality of protruding parts are separated from one another.

In accordance with some other embodiments of the present disclosure, a package structure including a semiconductor package and a ring structure is provided. The semiconductor package is disposed on a substrate. The ring structure is disposed on the substrate and surrounding the semiconductor package, wherein when a minimum distance of a first sidewall of the semiconductor package to an inner sidewall of the ring structure is d3, a minimum distance of a second sidewall of the semiconductor package to an inner sidewall of the ring structure is d4, then a maximum distance d5 from a corner of the semiconductor package to an inner corner of the ring structure satisfy the following relationship: $d5 > \sqrt{((d3)^2+(d4)^2)}$, and the first sidewall is perpendicular to the second sidewall.

In accordance with yet another embodiment of the present disclosure, a method of fabricating a package structure is described. The package structure includes the following steps. A circuit substrate is provided. A semiconductor package is disposed on the circuit substrate, and electrically connected to the circuit substrate. A first ring structure is attached to the circuit substrate to surround the semiconductor package, wherein the first ring structure includes a central opening and a plurality of corner openings extending out from corners of the central opening, the semiconductor package is located in the central opening, and the plurality of corner openings is surrounding corners of the semiconductor package. A second ring structure is attached to the first ring structure to surround the semiconductor package, wherein the second ring structure comprises a second central opening that is overlapped with the central opening of the first ring structure.

Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A package structure, comprising:
   a circuit substrate;
   a semiconductor package disposed on and electrically connected to the circuit substrate; and
   a first ring structure attached to the circuit substrate and surrounding the semiconductor package, wherein the first ring structure comprises continuous inner sidewalls and continuous outer sidewalls, and wherein a central opening and a plurality of corner openings extending out from corners of the central opening are defined by the continuous inner sidewalls, the semiconductor package is located in the central opening, and the plurality of corner openings is surrounding corners of the semiconductor package, wherein the central opening and the plurality of corner openings are air openings, so that air spaces exist in between the continuous inner sidewalls and sidewalls of the semiconductor package, the continuous outer sidewalls of the first ring structure are aligned with sidewalls of the circuit substrate, and
   wherein a profile defined by the continuous inner sidewalls is kept consistent along a thickness direction from a bottommost surface to a topmost surface of the first ring structure.

2. The package structure according to claim 1, wherein the central opening of the first ring structure is a square-shaped or rectangular-shaped opening having four corners, and the plurality of corner openings extends out from the four corners of the square-shaped or rectangular-shaped opening.

3. The package structure according to claim 2, wherein the plurality of corner openings has a polygonal outline, a curved outline, or an irregular outline.

4. The package structure according to claim 2, wherein two of the plurality of corner openings are extending out from each of the four corners of the square-shaped or rectangular-shaped opening.

5. The package structure according to claim 1, wherein a minimum distance of the semiconductor package to a boundary of the central opening is smaller than a maximum distance from corners of the semiconductor package to a boundary of the plurality of corner openings.

6. The package structure according to claim 1, further comprising:
   a second ring structure attached to the first ring structure and surrounding the semiconductor package, wherein the second ring structure comprises a second central opening that is overlapped with the central opening of the first ring structure.

7. The package structure according to claim 6, wherein the second ring structure is stacked on top of the first ring structure along the thickness direction, and a thickness of the first ring structure measured along the thickness direction is greater than a thickness of the second ring structure measured along the thickness direction.

8. The package structure according to claim 6, wherein the first ring structure is attached to the circuit substrate through a first adhesive, and the second ring structure is attached to the first ring structure through a second adhesive.

9. The package structure according to claim 6, wherein from a top view of the package structure, an area of the central opening of the first ring structure is substantially equal to an area of the second central opening of the second ring structure.

10. A package structure, comprising:
    a circuit substrate;
    an interposer structure disposed on and electrically connected to the circuit substrate;
    a first semiconductor die and a plurality of second semiconductor dies disposed on a backside surface of the interposer structure and electrically connected to the interposer structure;
    an insulating encapsulant disposed on the backside surface of the interposer structure and surrounding the first semiconductor die and the plurality of second semiconductor dies;
    a first stiffener ring and a second stiffener ring attached to the circuit substrate, wherein the first stiffener ring is located in between the circuit substrate and the second stiffener ring, the second stiffener ring is stacked on top of the first stiffener ring along a first direction and physically separated from the circuit substrate by the first stiffener ring, and the interposer structure, the first semiconductor die and the plurality of second semiconductor dies are encircled by the first stiffener ring and the second stiffener ring, and wherein the first stiffener ring comprises a frame portion and a plurality of protruding parts extending out from inner surfaces of the frame portion towards the interposer structure, and each of the plurality of protruding parts are separated from one another, and wherein the second stiffener ring consists of a second frame portion, wherein the frame portion and the plurality of protruding parts of the first stiffener ring are overlapped with the second frame portion along the first direction, outer sidewalls of the second stiffener ring are aligned with outer sidewalls of the first stiffener ring, and a portion of inner sidewalls of the second stiffener ring is aligned with inner sidewalls of the plurality of protruding parts of the first stiffener ring, while another portion of the inner sidewalls of the second stiffener ring is misaligned with the inner sidewalls of the plurality of protruding parts of the first stiffener ring, and wherein from a top view of the package structure, a total opening area of the first stiffener ring is greater than a total opening area of the second stiffener ring.

11. The package structure according to claim 10, wherein the second frame portion of the second stiffener ring includes an overlapping part and non-overlapping parts, the overlapping part of the second frame portion is overlapped with the frame portion and the plurality of protruding parts of the first stiffener ring, and the non-overlapping parts of the second frame portion are located at four inner corners of the second stiffener ring, wherein air spaces exist between a bottom surface of the non-overlapping parts of the second frame portion and the circuit substrate.

12. The package structure according to claim 10, wherein each of the plurality of protruding parts comprises:
a first side joined with the frame portion;
a second side opposite to the first side, wherein the second side comprises a planar surface that is parallel to a side surface of the interposer structure; and
a third side and a fourth side respectively joining the second side to the first side.

13. The package structure according to claim 12, wherein the third side and the fourth side comprises curved surfaces.

14. The package structure according to claim 12, wherein the first side, the second side, the third side and the fourth side of each of the plurality of protruding parts are joined together to form a rectangular outline or a trapezoidal outline.

15. The package structure according to claim 10, wherein a thickness of the first stiffener ring is greater than a thickness of the second stiffener ring.

16. The package structure according to claim 10, wherein the plurality of second semiconductor dies are dummy dies without any electrical functions.

17. A package structure, comprising:
a semiconductor package disposed on a substrate; and
a continuous ring structure disposed on the substrate and surrounding the semiconductor package, wherein when a minimum distance of a first sidewall of the semiconductor package to an inner sidewall of the continuous ring structure is d3, a minimum distance of a second sidewall of the semiconductor package to an inner sidewall of the continuous ring structure is d4, then a maximum distance d5 from a corner of the semiconductor package to an inner corner of the continuous ring structure satisfy the following relationship:

$$d5 \sqrt{((d3)^2+(d4)^2)}, \text{ and}$$

the first sidewall is perpendicular to the second sidewall, and wherein air spaces exist in between the inner sidewall of the continuous ring structure and the first sidewall of the semiconductor package, and between the inner sidewall of the continuous ring structure and the second sidewall of the semiconductor package, and a second ring structure disposed on top of the continuous ring structure and surrounding the semiconductor package, and physically separated from the substrate, wherein the second ring structure comprises a second frame portion with an overlapping part and non-overlapping parts, the overlapping part of the second frame portion is overlapped with the frame portion and the plurality of protruding parts of the continuous ring structure, and the non-overlapping parts of the second frame portion are located at four inner corners of the second ring structure, and the non-overlapping parts of the second frame portion are overhanging the continuous ring structure and exposed to the air spaces.

18. The package structure according to claim 17, wherein the continuous ring structure comprises a frame portion and a plurality of protruding parts extending out from inner surfaces of the frame portion towards the semiconductor package, and each of the plurality of protruding parts are separated from one another.

19. The package structure according to claim 17, wherein the continuous ring structure is made of a material having a smaller coefficient of thermal expansion than a material of the second ring structure.

20. The package structure according to claim 17, further comprising:
a lid structure disposed on the second ring structure and covering the semiconductor package; and
a thermal interface metal sandwiched between the lid structure and the semiconductor package.

* * * * *